US009638780B2

(12) United States Patent
Ookawa

(10) Patent No.: US 9,638,780 B2
(45) Date of Patent: May 2, 2017

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-Shi, Tochigi-Ken (JP)

(72) Inventor: Masashi Ookawa, Otawara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 579 days.

(21) Appl. No.: 14/258,399

(22) Filed: Apr. 22, 2014

(65) Prior Publication Data
US 2014/0239950 A1 Aug. 28, 2014

Related U.S. Application Data

(63) Continuation of application No. PCT/JP2014/052909, filed on Feb. 7, 2014.

(30) Foreign Application Priority Data

Feb. 25, 2013 (JP) ................................. 2013-034816

(51) Int. Cl.
*G01G 3/00* (2006.01)
*G01R 33/54* (2006.01)
(Continued)

(52) U.S. Cl.
CPC ......... *G01R 33/543* (2013.01); *G01R 33/565* (2013.01); *G01R 33/3856* (2013.01)

(58) Field of Classification Search
CPC . G01R 33/543; G01R 33/565; G01R 33/3856
(Continued)

(56) References Cited

U.S. PATENT DOCUMENTS 5,677,626 A * 10/1997 Miyazaki ........... G01R 33/4835
324/307
2009/0160440 A1* 6/2009 Yui ....................... G01R 33/561
324/307
(Continued)

FOREIGN PATENT DOCUMENTS

JP 2009-240767 10/2009
JP 2012-30051 2/2012

OTHER PUBLICATIONS

International Search Report for PCT/JP2014/052909 mailed Apr. 1, 2014.
(Continued)

*Primary Examiner* — Susan Lee
(74) *Attorney, Agent, or Firm* — Nixon & Vanderhye P.C.

(57) ABSTRACT

In one embodiment, an MRI apparatus (10) includes a gap calculating unit (65), a candidate calculating unit (66) and a sequence setting unit (61). The gap calculating unit calculates a gap between the center frequency of an RF pulse and a resonance center frequency, after start of a pulse sequence. The candidate calculating unit calculates a plurality of candidate timings so as to avoid influence of a CF scan for measuring the resonance center frequency on MR signals, when the CF scan is inserted in the pulse sequence. The sequence setting unit sets the pulse sequence so that CF scans are inserted in the pulse sequence at the timings according to the gap and the candidate timings. Each time the CF scan is executed, the center frequency of an RF pulse is updated and the pulse sequence is continued. Thereby, the MR signals are acquired.

19 Claims, 8 Drawing Sheets

(51) Int. Cl.
*G01R 33/565* (2006.01)
*G01R 33/385* (2006.01)

(58) Field of Classification Search
USPC .......................................................... 324/309
See application file for complete search history.

(56) References Cited

U.S. PATENT DOCUMENTS

| 2009/0224761 | A1  | 9/2009  | Umeda |
| 2011/0304331 | A1* | 12/2011 | Takahashi .......... G01R 33/5659 324/309 |
| 2012/0001635 | A1  | 1/2012  | Ookawa |
| 2013/0154642 | A1* | 6/2013  | Sueoka ............ G01R 33/34015 324/309 |

OTHER PUBLICATIONS

English Translation of International Preliminary Report on Patentability issued Aug. 25, 2015 for Application No. PCT/JP2014/052909.

* cited by examiner

MAGNETIC RESONANCE IMAGING APPARATUS AND MAGNETIC RESONANCE IMAGING METHOD

CROSS-REFERENCE TO RELATED APPLICATIONS

This application is a Continuation Application of No. PCT/JP2014/52909, filed on Feb. 7, 2014, and the PCT application is based upon and claims the benefit of priority from Japanese Patent Application No. 2013-34816, filed on Feb. 25, 2013, the entire contents of which are incorporated herein by reference.

BACKGROUND OF THE INVENTION

1. Field of the Invention

Embodiments described herein relate generally to a magnetic resonance imaging apparatus and a magnetic resonance imaging method.

2. Description of the Related Art

MRI is an imaging method which magnetically excites nuclear spin of an object (a patient) placed in a static magnetic field with an RF pulse having the Larmor frequency and reconstructs an image on the basis of MR signals generated due to the excitation. The aforementioned MRI means magnetic resonance imaging, the RF pulse means a radio frequency pulse, and the MR signal means a nuclear magnetic resonance signal.

An MRI apparatus has a gradient magnetic field coil that applies gradient magnetic fields to an imaging region so as to provide an MR signal with spatial positional information. The gradient magnetic field coil generates significant heat during imaging because of pulse electric currents repeatedly supplied thereto.

If the temperature of the gradient magnetic field coil rises, the temperature of closely disposed iron shims rises, this changes the magnetic field in the imaging space, and thereby the center frequency of the magnetic resonance of hydrogen atoms in the object also varies.

In the following explanation, the center frequency of the magnetic resonance of hydrogen atoms is simply referred to as the resonance center frequency.

The center frequency of an RF pulse such as a fat suppression prepulse and a 90 degrees excitation pulse is selected during an imaging preparation step such as a prescan, for example, on the basis of the Larmor frequency of hydrogen atoms determined in accordance with the intensity of the static magnetic field.

However, if the resonance center frequency of the hydrogen atoms in fat tissue shifts because of the heat generation of the gradient magnetic field coil during imaging after the conditions of the fat suppression prepulse are selected in the imaging preparation step, sufficient effect of the fat suppression are not obtained in some cases.

Especially, in continuous imaging which takes a long time such as dynamic imaging, the amount of heat generation of the gradient magnetic field coil increases following time elapse from the start of imaging, and accompanied with this, the shift amount of the resonance center frequency increases sometimes. In this case, images whose data are acquired at later points in time suffer influence of more degradation of the effect of the fat suppression prepulse, and sometimes satisfactory images are not obtained.

Then, the MRI apparatus written in Japanese Patent Application Laid-open (KOKAI) Publication No. 2012-30051 preliminarily stores the relationship between the amount of the temperature variation of the gradient magnetic field coil and the resonance center frequency as shift data, and measures the temperature of the gradient magnetic field coil plural times during imaging. Then, the center frequency of the RF pulses is corrected in each of the vacant periods selected by a user, in such a manner that the center frequency of the RF pulses accords with the resonance center frequency determined by the measured temperature variation and the shift data. Thereby, degradation of the effects of the RF pulses such as the fat suppression prepulse is prevented.

Although the invention of Japanese Patent Application Laid-open (KOKAI) Publication No. 2012-30051 has excellent functions and effects, it is preferable that the center frequency of the RF pulses is as close to the actual resonance center frequency at transmission timing of the RF pulses as possible.

Therefore, a novel technology to set the center frequency of the RF pulses more appropriately than the conventional technology regardless of the shift of the resonance center frequency caused by heat generation of a gradient magnetic field coil has been desired in MRI.

DETAILED DESCRIPTION

Figure 1:
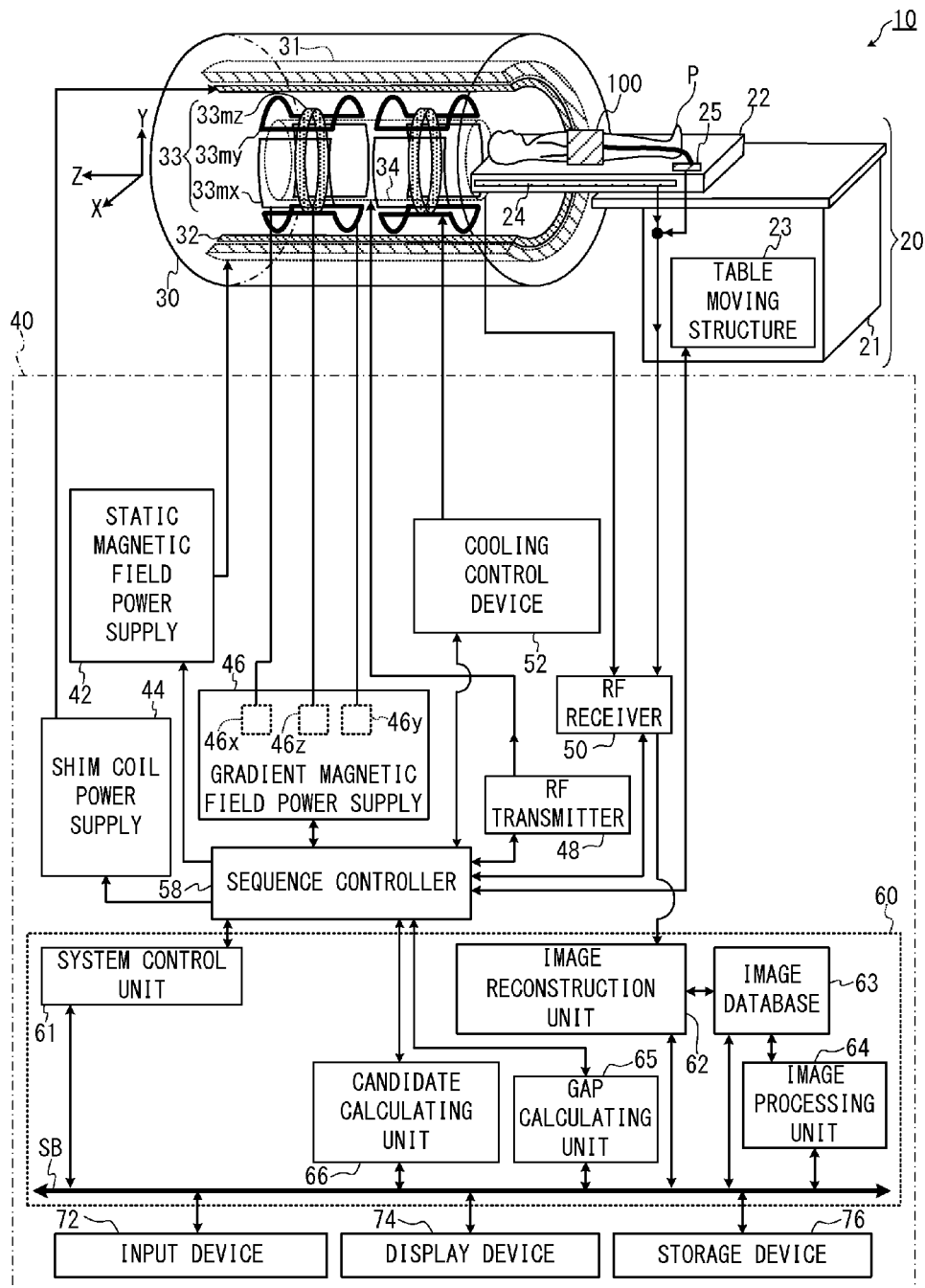
FIG. 1 is a block diagram showing general structure of the MRI apparatus of the first embodiment.

Hereinafter, examples of aspects which embodiments of the present invention can take will be explained per aspect.

(1) According to one embodiment, an MRI apparatus acquires MR signals from an imaging region by executing a pulse sequence with application of a gradient magnetic field and RF pulses, and reconstructs image data on the basis of the MR signals. This MRI apparatus includes a gap calculating unit, a candidate calculating unit, a sequence setting unit, a signal acquisition unit and an image reconstruction unit.

The gap calculating unit calculates a gap between a center frequency of an RF pulse and a center frequency of magnetic resonance of hydrogen atoms in the imaging region, after start of the pulse sequence.

The candidate calculating unit calculates a plurality of candidate timings for inserting a center frequency scan on the basis of imaging conditions so as to avoid influence of the center frequency scan on the MR signals used for reconstructing the image data, when the center frequency scan is inserted in the pulse sequence. Here, the center frequency scan is a scan in which the center frequency of magnetic resonance of hydrogen atoms is measured with application of an RF pulse.

The sequence setting unit sets the pulse sequence, in such a manner that the center frequency scan is inserted in the pulse sequence at a timing in accordance with the plurality of candidate timings and the gap.

The signal acquisition unit acquires the MR signals from the imaging region by executing the pulse sequence, in such a manner that the center frequency of an RF pulse is set (determined) again to a value reflecting an execution result of the center frequency scan and then the pulse sequence is continued each time of executing the center frequency scan.

The image reconstruction unit reconstructs the image data on the basis of the MR signals acquired by the signal acquisition unit.

(2) In another embodiment, an MRI method is a method that acquires MR signals from an imaging region by executing a pulse sequence with application of a gradient magnetic field and RF pulses, and reconstructs image data on the basis of the MR signals. This MRI method includes the following steps.

One of the steps is to calculate a gap between a center frequency of an RF pulse and a center frequency of magnetic resonance of hydrogen atoms in the imaging region, after start of the pulse sequence.

Another of the steps is to calculate a plurality of candidate timings for inserting a center frequency scan on the basis of imaging conditions so as to avoid influence of the center frequency scan on the MR signals used for reconstructing the image data, when the center frequency scan is inserted in the pulse sequence. Here, the center frequency scan is a scan in which the center frequency of magnetic resonance of hydrogen atoms is measured with application of an RF pulse.

Another of the steps is to set the pulse sequence in such a manner that the center frequency scan is inserted in the pulse sequence at a timing in accordance with the plurality of candidate timings and the gap.

Another of the steps is to acquire the MR signals from the imaging region by executing the pulse sequence, in such a manner that the center frequency of an RF pulse is set (determined) again to a value reflecting the execution result of the center frequency scan and then the pulse sequence is continued each time of executing the center frequency scan.

The other of the steps is to reconstruct the image data on the basis of the MR signals acquired by the pulse sequence.

MRI apparatuses and MRI methods according to embodiments of the present invention will be described with reference to the accompanying drawings. Note that the same reference numbers are given for identical components in each figure, and overlapping explanation is abbreviated.

Structure of the First Embodiment

FIG. 1 is a block diagram showing the general structure of the MRI apparatus 10 according to the first embodiment. As an example here, the components of the MRI apparatus 10 will be explained by classifying them into three groups which are a bed unit 20, a gantry 30 and a control device 40.

Firstly, the bed unit 20 includes a bed 21, a table 22, and a table moving structure 23 disposed inside the bed 21. An object P is loaded on the top surface of the table 22. In addition, a reception RF coil device 24 is disposed inside the table 22.

Furthermore, a plurality of connection ports 25 to which wearable type RF coil devices are connected are disposed on the top surface of the table 22.

Although an RF coil device 100 for receiving MR signals is loaded on the object P as an example in FIG. 1, the RF coil device 100 is not an indispensable component.

The bed 21 supports the table 22 in such a manner that the table 22 can move in the horizontal direction (i.e. the Z axis direction of the apparatus coordinate system).

The table moving structure 23 adjusts the position of the table 22 in the vertical direction by adjusting the height of the bed 21, when the table 22 is located outside the gantry 30.

In addition, the table moving structure 23 inserts the table 22 into inside of the gantry 30 by moving the table 22 in the horizontal direction and moves the table 22 to outside of the gantry 30 after completion of imaging.

Secondly, the gantry 30 is shaped in the form of a cylinder, for example, and is installed in an imaging room. The gantry 30 includes a static magnetic field magnet 31, a shim coil unit 32, a gradient magnetic field coil unit 33 and an RF coil unit 34.

The static magnetic field magnet 31 is, for example, a superconductivity coil and shaped in the form of a cylinder. The static magnetic field magnet 31 forms a static magnetic field in an imaging space by using electric currents supplied from the later-described static magnetic field power supply 42.

The aforementioned "imaging space" means, for example, a space in the gantry 30 in which the object P is placed and to which the static magnetic field is applied. Note that the static magnetic field magnet 31 may include a permanent magnet which makes the static magnetic field power supply 42 unnecessary.

The shim coil unit 32 is, for example, shaped in the form of a cylinder and arranged inside the static magnetic field magnet 31 so as to become coaxial with the static magnetic field magnet 31. The shim coil unit 32 forms an offset magnetic field that uniforms the static magnetic field by using electric currents supplied from the later-described shim coil power supply 44 of the control device 40.

The gradient magnetic field coil unit 33 is, for example, shaped in the form of a cylinder and arranged inside the shim coil unit 32. The gradient magnetic field coil unit 33 includes an X axis gradient magnetic field coil $33mx$, a Y axis gradient magnetic field coil $33my$ and a Z axis gradient magnetic field coil $33mz$.

In this specification, the X axis, the Y axis and the Z axis are assumed to be those of the apparatus coordinate system unless otherwise specifically noted. As an example here, the apparatus coordinate system, whose X axis, Y axis and Z axis are perpendicular to each other, is defined as follows.

Firstly, the Y axis direction is defined as the vertical direction, and the table 22 is disposed in such a position that the direction of the normal line of its top surface accords with the Y axis direction. The horizontal moving direction of the table 22 is defined as the Z axis direction, and the gantry 30 is installed in such a manner that its axis direction accords with the Z axis direction. The X axis direction is the direction perpendicular to these Y axis direction and Z axis direction, and is the width direction of the table 22 in the example of FIG. 1.

The X axis gradient magnetic field coil 33$mx$ forms a gradient magnetic field Gx in the X axis direction in an imaging region in accordance with an electric current supplied from the later-described X axis gradient magnetic field power supply 46$x$.

Similarly, the Y axis gradient magnetic field coil 33$my$ forms a gradient magnetic field Gy in the Y axis direction in the imaging region in accordance with an electric current supplied from the later-described Y axis gradient magnetic field power supply 46$y$.

Similarly, the Z axis gradient magnetic field coil 33$mz$ forms a gradient magnetic field Gz in the Z axis direction in the imaging region in accordance with an electric current supplied from the later-described Z axis gradient magnetic field power supply 46$z$.

Thereby, directions of a gradient magnetic field Gss in a slice selection direction, a gradient magnetic field Gpe in a phase encoding direction and a gradient magnetic field Gro in a readout (frequency encoding) direction can be arbitrarily selected as logical axes, by combining the gradient magnetic fields Gx, Gy and Gz in the X axis, the Y axis and the Z axis directions as three physical axes of the apparatus coordinate system.

The above "imaging region" means, for example, at least a part of an acquisition range of MR signals used to generate one image or one set of images, which becomes an image. The imaging region is three-dimensionally defined as a part of the imaging space by the apparatus coordinate system, for example. For example, when MR signals are acquired in a range wider than a region made into an image in order to prevent wraparound artifact, the imaging region is a part of the acquisition range of MR signals. On the other hand, in some cases, the entire acquisition range of MR signals becomes an image, and the imaging region accords with the acquisition range of MR signals. In addition, the above "one set of images" means, for example, a plurality of images when MR signals of the plurality of images are acquired in a lump in one pulse sequence such as multi-slice imaging.

As an example here, the imaging region will be referred to as a slice if the imaging region is a thin region or as a slab if the imaging region has a certain thickness.

The RF coil unit 34 is, for example, shaped in the form of a cylinder and arranged inside the gradient magnetic field coil unit 33. The RF coil unit 34 includes, for example, a whole body coil which combines the function of transmitting RF pulses and detecting MR signals and a transmission RF coil which exclusively performs transmission of RF pulses.

Thirdly, the control device 40 includes the aforementioned static magnetic field power supply 42, the shim coil power supply 44, the gradient magnetic field power supply 46, an RF transmitter 48, an RF receiver 50, a cooling control device 52, a sequence controller 58, the operation device 60, an input device 72, a display device 74 and the storage device 76.

The cooling control device 52 circulates cooling medium in cooling pipes 38 (see the later-described FIG. 3) so as to cool down the gradient magnetic field coil unit 33 and the RF coil unit 34 inside the gantry 30.

The gradient magnetic field power supply 46 includes the X axis gradient magnetic field power supply 46$x$, the Y axis gradient magnetic field power supply 46$y$ and the Z axis gradient magnetic field power supply 46$z$.

The X axis gradient magnetic field power supply 46$x$, the Y axis gradient magnetic field power supply 46$y$ and the Z axis gradient magnetic field power supply 46$z$ supply the respective electric currents for forming the gradient magnetic field Gx, the gradient magnetic field Gy and the gradient magnetic field Gz to the X axis gradient magnetic field coil 33$mx$, the Y axis gradient magnetic field coil 33$my$ and the Z axis gradient magnetic field coil 33$mz$, respectively.

The RF transmitter 48 generates RF pulse electric currents of the Larmor frequency for causing nuclear magnetic resonance in accordance with control information inputted from the sequence controller 58, and outputs the generated RF pulse electric currents to the RF coil unit 34. The RF pulses in accordance with these RF pulse electric currents are transmitted from the RF coil unit 34 to the object P.

The whole body coil of the RF coil unit 34, the reception RF coil device 24 and the RF coil device 100 detect MR signals generated due to excited nuclear spin inside the object P by the RF pulses, and the detected MR signals are inputted to the RF receiver 50.

The RF receiver 50 generates raw data which are digitized complex number data of MR signals obtained by performing predetermined signal processing on the received MR signals and then performing A/D (analogue to digital) conversion on them.

The RF receiver 50 inputs the generated raw data of MR signals to the late-described image reconstruction unit 62 of the operation device 60.

The sequence controller 58 stores control information needed in order to make the gradient magnetic field power supply 46, the RF transmitter and the RF receiver 50 drive in accordance with commands from the operation device 60. The aforementioned control information includes, for example, sequence information describing operation control information such as intensity, application period and application timing of the pulse electric currents which should be applied to the gradient magnetic field power supply 46.

The sequence controller 58 generates the gradient magnetic fields Gx, Gy and Gz and RF pulses by driving the gradient magnetic field power supply 46, the RF transmitter 48 and the RF receiver 50 in accordance with a predetermined sequence stored.

The operation device 60 includes a system control unit 61, a system bus SB, an image reconstruction unit 62, an image database 63, an image processing unit 64, a gap calculating unit 65 and a candidate calculating unit 66.

The system control unit 61 performs system control of the MRI apparatus 10 in setting of imaging conditions of a main scan, an imaging operation and image display after imaging through interconnection such as the system bus SB.

The aforementioned term "imaging condition" refers to under what condition RF pulses or the like are transmitted in what type of pulse sequence, or under what condition MR signals are acquired from the object P, for example.

As parameters of the imaging conditions, for example, there are the type of the pulse sequence such as spin echo and parallel imaging, the imaging region as positional information in the imaging space, a flip angle, a repetition time (TR), the number of slices, and an imaging part. The above imaging part means a region of the object P to be imaged, such as a head, a chest, and an abdomen.

The aforementioned "main scan" is a scan for imaging an intended diagnosis image such as a T1 weighted image, and it does not include a scan for acquiring MR signals for a scout image or a calibration scan. A scan is an operation of acquiring MR signals, and it does not include image reconstruction processing.

The calibration scan is a scan for determining unconfirmed elements of imaging conditions, conditions and data used for image reconstruction processing and correction processing after the image reconstruction, and the calibration is performed separately from the main scan.

In addition, the system control unit 61 makes the display device 74 display screen information for setting imaging conditions, sets the imaging conditions on the basis of command information from the input device 72, and inputs the determined imaging conditions to the sequence controller 58. In addition, the system control unit 61 makes the display device 74 display images indicated by the generated display image data after completion of imaging.

The gap calculating unit 65 calculates a gap (difference) between the resonance center frequency in an imaging region and the center frequency of the RF pulses, after the start of the pulse sequence. As to the calculation method of the above gap, it will be explained in the later-described FIG. 10 as a flow chart.

The RF pulses herein are, for example, suppression pulses such as a fat suppression prepulse and silicone suppression pulse, pre-saturation pulse, a labeling pulse used in an ASL (Arterial Spin Labeling) method such as t-SLIP (Time Spatial Labeling Inversion Pulse) method, an excitation RF pulse for data acquisition, a refocusing RF pulse for data acquisition and so on.

The candidate calculating unit 66 calculates a plurality of candidate timings, as candidates for inserting a center frequency scan (hereinafter, referred to as a CF scan) in the middle of the pulse sequence.

The CF scan is a scan in which the resonance center frequency is measured on the basis of the local maximum value or the like of the frequency spectrum of the detected MR signals by transmitting RF pulses (for example, refer to Japanese Patent Application Laid-open (KOKAI) Publication No. 2009-34152). As to the calculation method of the candidate timings, it will be described later.

The system control unit 61 sets the pulse sequence in such a manner that the CF scans are inserted in the pulse sequence at timings in accordance with the gap calculated by the gap calculating unit 65 and the plurality of candidate timings.

The input device 72 provides a user with a function to set the imaging conditions and image processing conditions.

The image reconstruction unit 62 arranges and stores the raw data of MR signals inputted from the RF receiver 50 as k-space data, in accordance with the phase encode step number and the frequency encode step number. The above k-space means a frequency space.

The image reconstruction unit 62 generates image data of the object P by performing image reconstruction processing including such as two-dimensional Fourier transformation and so on. The image reconstruction unit 62 stores the generated image data in the image database 63.

The image processing unit 64 takes in the image data from the image database 63, performs predetermined image processing on them, and stores the image data after the image processing in the storage device 76 as display image data.

The storage device 76 stores the display image data after adding accompanying information such as the imaging conditions used for generating the display image data and information of the object P (patient information) to the display image data.

Note that, the operation device 60, the input device 72, the display device 74 and the storage device 76 may be configured as one computer and may be installed in a control room, for example.

In addition, though the components of the MRI apparatus 10 are classified into three groups (the gantry 30, the bed unit 20 and the control device 40), this is only an example of interpretation.

For example, the table moving structure 23 may be interpreted as a part of the control device 40.

Alternatively, the RF receiver 50 may be included not outside the gantry 30 but inside the gantry 30. In this case, for example, an electronic circuit board that is equivalent to the RF receiver 50 may be disposed in the gantry 30. Then, the MR signals, which are analog electrical signals converted from the electromagnetic waves by the reception RF coil device 24 and so on, may be amplified by a pre-amplifier in the electronic circuit board, then the amplified signals may be outputted to the outside of the gantry 30 as digital signals and inputted to the image reconstruction unit 62. In outputting the signals to the outside of the gantry 30, for example, an optical communication cable is preferably used to transmit the signals in the form of optical digital signals. This is because the effect of external noise is reduced.

Figure 2:
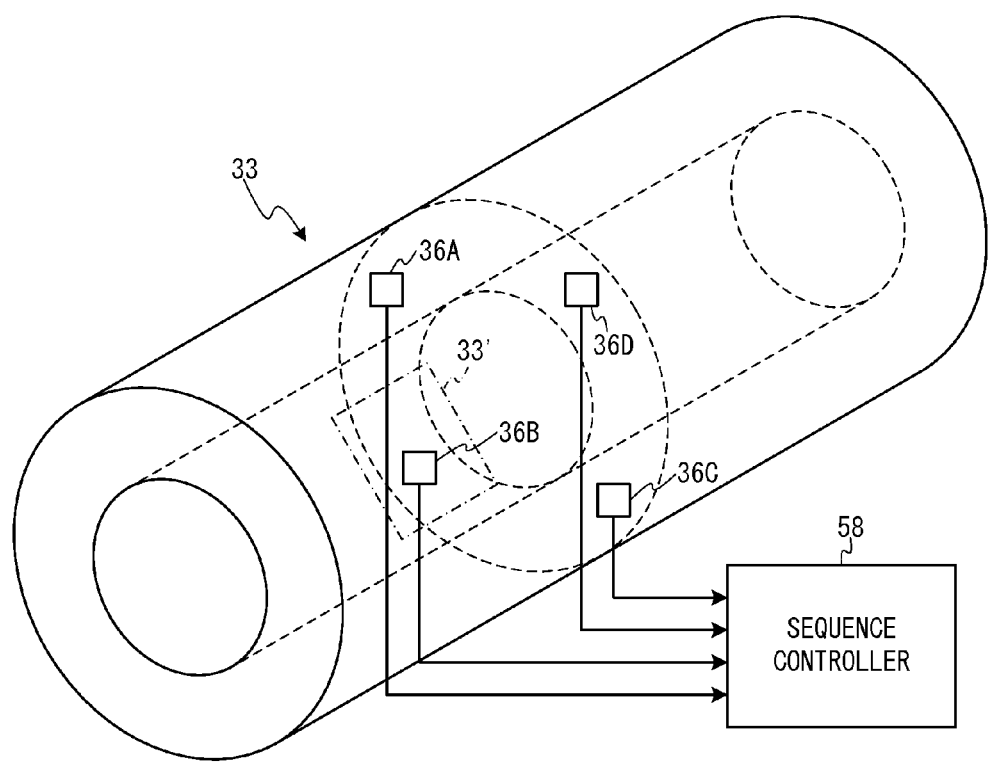
FIG. 2 is a schematic perspective view showing an example of arrangement of temperature sensors in a gradient magnetic field coil unit.

FIG. 2 is a schematic perspective view showing an example of the arrangement of the temperature sensors 36A, 36B, 36C and 36D in the gradient magnetic field coil unit 33. The four temperature sensors 36A, 36B, 36C and 36D are arranged at regular intervals along a cylindrical shape in an annular cross section thereof in an X-Y plane in the apparatus coordinate system including a point that constitutes the magnetic field center during imaging.

Each of the temperature sensors 36A, 36B, 36C and 36D inputs the detected temperature into the sequence controller 58. Note that, the arrangement and the number of the temperature sensors shown in FIG. 2 are only an example, and the arrangement and the number of temperature sensors are not limited to those in the example described above.

Figure 3:
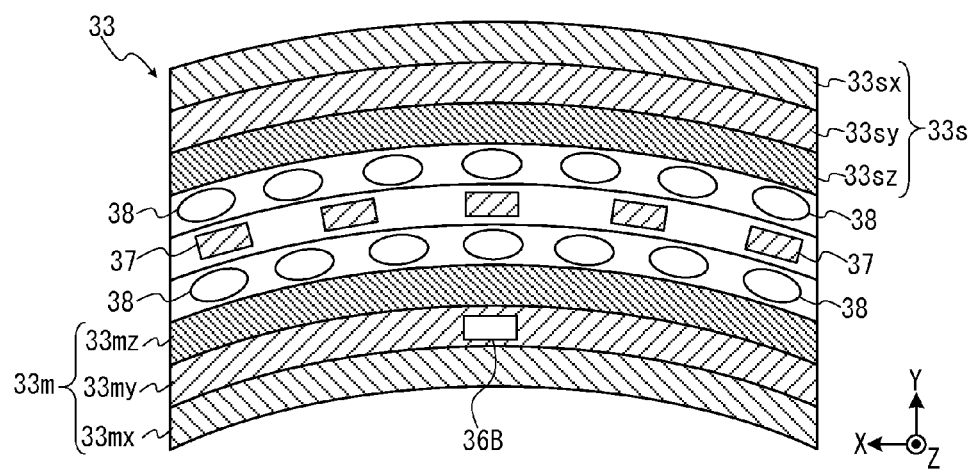
FIG. 3 is a schematic cross-sectional view of the gradient magnetic field coil unit.

FIG. 3 is a schematic cross-sectional view of the gradient magnetic field coil unit 33 shown in FIG. 2, and it shows the cross-section of the region surrounded by a chain line frame in FIG. 2. As shown in FIG. 3, the gradient magnetic field coil unit 33 has a multilayer structure incorporating an active shield, for example.

That is, the gradient magnetic field coil unit 33 has a layer of a main coil 33$m$, a layer of a shield coil 33$s$, and an insertion layer including a plurality of shim trays 37, and embedded layers including a plurality of cooling pipes 38 interposed between the layer of the main coil 33$m$ and the layer of the shield coil 33$s$. In FIG. 3, each of the shim trays 37 is shown as a shaded rectangular region, and each of the cooling pipes 38 is shown as a white elliptical region.

The main coil 33$m$ includes the aforementioned X axis gradient magnetic field coil 33$mx$, the Y axis gradient magnetic field coil 33$my$, and the Z axis gradient magnetic field coil 33$mz$.

The shield coil 33$s$ includes an X axis shield coil 33$sx$, an Y axis shield coil 33$sy$, and a Z axis shield coil 33$sz$, which produce magnetic fields when electric currents are supplied thereto from the gradient magnetic field power supply 46 respectively.

That is, the X axis shield coil 33sx, the Y axis shield coil 33sy, and the Z axis shield coil 33sz produce magnetic fields in a region outside the main coil 33m. The three magnetic fields respectively produced by X axis shield coil 33sx, the Y axis shield coil 33sy, and the Z axis shield coil 33sz correspond to the X axis gradient magnetic field coil 33mx, the Y axis gradient magnetic field coil 33my and the Z axis gradient magnetic field coil 33mz respectively, and shield the gradient magnetic fields Gx, Gy and Gz produced by the main coil 33m, respectively.

A plurality of shim trays 37 are inserted at substantially regular intervals between the embedded layer of the cooling pipes 38 closer to the main coil 33m and the embedded layer of the cooling pipes 38 closer to the shield coil 33s. Since the cooling medium is circulated in the cooling pipes 38, heat generated by the main coil 33m and the shield coil 33s is less likely to transmit to the shim trays 37.

The cooling control device 52 circulates cooling water inside the cooling pipes 38 in order to prevent the heat generated by the main coil 33m and the shield coil 33s from transferring to the shim trays 37.

The shim trays 37 are, for example, made of a nonmagnetic and nonconductive resin and substantially rod-shaped and extend in the Z axis direction. Each of the shim trays 37 contains a predetermined number of iron shims (not shown).

The iron shims have an effect of uniformizing magnetic field intensity distribution of the static magnetic field formed in the imaging space.

Note that, in the arrangement shown in FIG. 3, the temperature sensors 36A to 36D detect the temperature of the Y axis gradient magnetic field coil 33my, and this is only an example. In an alternative arrangement, more temperature sensors may be used to separately detect the temperature of the X axis gradient magnetic field coil 33mx, the Y axis gradient magnetic field coil 33my, the X axis shield coil 33sx, the Y axis shield coil 33sy, and the Z axis shield coil 33sz respectively.

As a further alternative, the temperature sensors 36A to 36D may detect the temperatures of the shim trays 37. That is, any arrangement is possible as far as the temperature of the gradient magnetic field coil unit 33 can be detected.

Thus, though the structure of detecting the temperature of the cooling medium inside the cooling pipes 38 is possible, the structure of detecting the temperature inside the gradient magnetic field coil unit 33 excluding the cooling pipes 38 and their surrounding areas is preferable. This is because the temperature of regions located adjacent to the cooling pipes 38 is the lowest inside the gradient magnetic field coil unit 33 due to the cooling medium circulating inside the cooling pipes 38 for suppressing temperature rise of the gradient magnetic field coil unit 33.

That is, an arrangement that directly and accurately detects the temperature of an element that is directly involved with the intensity of the magnetic field in the imaging region is preferable. In this respect, detecting the temperature of the shim trays 37 containing the iron shims or the main coil 33m is superior to detecting the temperature of the cooling pipes 38 and their surroundings.

In addition, the temperature sensors 36A to 36D may be infrared radiation thermometers, thermistors, or thermocouples that substantially directly measure the temperature of the main coil 33m. The infrared radiation thermometer is capable of measuring the temperature of a measurement object in a noncontact manner, and therefore is advantageous in terms of taking a shorter time for measuring temperature. In this respect, the infrared radiation thermometer is superior to measurement methods requiring that the temperatures of the temperature sensor and the object have to become equal by heat transfer.

Next, the method of calculating the candidate timings of the CF scans by the candidate calculating unit 66 will be explained.

Figure 4:
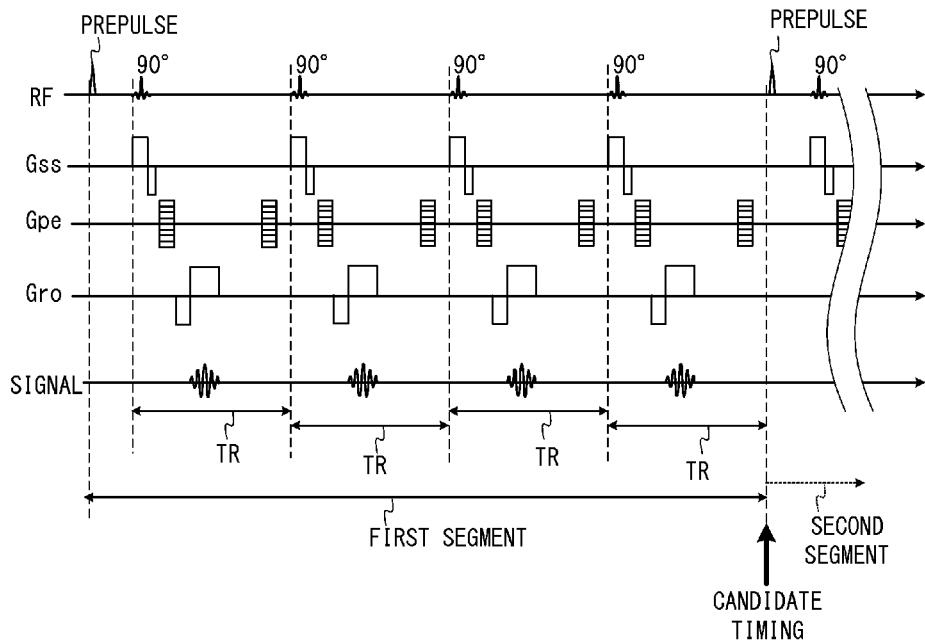
FIG. 4 is a local timing chart showing each candidate timing for inserting a CF scan in an example of a pulse sequence on the basis of an FFE method.

FIG. 4 is a local timing chart showing each candidate timing for inserting the CF scan in an example of a pulse sequence on the basis of an FFE (Fast Field Echo) method.

Figure 5:
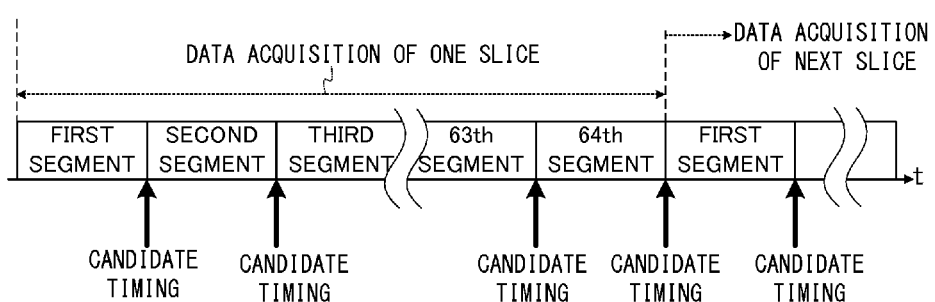
FIG. 5 is a holistic timing chart showing each candidate timing for inserting a CF scan in the pulse sequence of an FFE method in FIG. 4.

FIG. 5 is a holistic timing chart showing each candidate timing for inserting the CF scan in the pulse sequence of an FFE method in FIG. 4.

In FIG. 4, each horizontal axis corresponds to elapsed time t, RF in the upper part indicates RF pulses, Gss below that indicates the gradient magnetic field in the slice selection direction, Gpe below that indicates the gradient magnetic field in the phase encode direction, Gro below that indicates the gradient magnetic field in the readout (frequency encode) direction, and SIGNAL at the bottom indicates generated MR signals, respectively.

As an example here, consider a case where MR signals for an image of one slice are separately acquired in 64 segments and the phase encode step number and the frequency encode step number of the image are both 256.

That is, in each segment, MR signals of four phase encode steps are acquired. Acquisition of an MR signal of one phase encode step is defined as one cycle.

For example, a prepulse such as a fat suppression prepulse and so on is transmitted at the beginning of each segment. However, transmission of a prepulse is optional (nonessential).

Next, a gradient magnetic field in the slice selection direction is applied together with an excitation RF pulses whose flip angle is 90 degrees.

Next, a gradient magnetic field in the phase encode direction is applied, and an MR signal is detected under application of a gradient magnetic field in the in the readout direction.

Then, at the end of one cycle, a compensation gradient magnetic field, whose polarity is inverted from the gradient magnetic field in the phase encode direction applied earlier in the cycle, is applied in the phase encode direction. Thereby, the influence of the gradient magnetic field in the phase encode direction is canceled before the next cycle.

The foregoing is the acquisition of the MR signal of one phase encode step.

After this, the MR signals of three phase encode steps are acquired by repeating the similar operation three times except that the prepulse is not applied.

This concludes one segment, and after the first segment, MR signals of four phase encode steps are acquired as the second segment in the way similar to above.

The prepulse is applied only at the beginning of each segment.

In the above pulse sequence, consider the candidate timing that has little influence on artifact in the case of inserting a CF scan. The above "the candidate timing that has little influence on artifact" means, for example, influence of the RF pulses of the CF scan on the MR signals used for reconstructing image data is avoided.

More specifically, if the phase encode is zero, it is enough that the phase encode gradient magnetic field is zero, and the intensity of the detected MR signal becomes the maximum. In addition, in each of the MR signals, the maximum value as the center of the signal is arranged to the center in a k-space by subtracting a cosine function or a sine function of the carrier frequency. Therefore, the signal value (data value) becomes larger in the k-space data, as it is closer to the center (i.e. as its phase encode is closer to zero and as it is closer to the center of the sampling time).

That is, the closer to the center (zero) its phase encode step is, the more it becomes susceptible to artifact. On the other hand, at the end of the phase encode step (in the example of 256 times 256 matrix, the end is −127 or +128), it contains little image information originally and thus it is less susceptible to artifact.

Thus, the above "influence of the RF pulses of the CF scan on the MR signals used for reconstructing image data is avoided" does not mean that the influence of the RF pulses is perfectly avoided but means that the influence of the RF pulses of the CF scan is relatively little as compared with a previous timing and a subsequent timing.

Therefore, because the candidate timing of the CF scan (the timing at which influence of the RF pulse(s) of the CF scan is avoided) is different depending on the type of the pulse sequence and a transmission region of the RF pulse(s) in the CF scan, it cannot necessarily be uniformly defined.

For example, the more distant a transmission region of an RF pulse (acquisition region of MR signals) in the CF scan is from an imaging cross-section, the less influence the RF pulse in the CF scan relatively has.

As an example here, the candidate calculating unit 66 calculates the candidate timings under the following rules.

That is, as each of the candidate timings, the candidate calculating unit 66 calculates the earliest timing so as to become the timing which is after completion of acquiring the MR signals corresponding to all the RF pulses (excluding the RF pulses in the CF scan) transmitted after the start of the pulse sequence.

Moreover, the candidate calculating unit 66 calculates the rest of the candidate timings so as to become timings which are respectively after completion of acquiring the MR signals corresponding to all the RF pulses (excluding the RF pulses in the CF scan) transmitted after the immediately preceding candidate timing.

In other words, as to all the RF pulses that have been already transmitted, the timing immediately after completing the acquisition of the respective MR signals corresponding to all the transmitted RF pulses is an example of candidate timings.

In the example of FIG. 4, the prepulse transmitted at the beginning of the first segment corresponds to the MR signals of the subsequent four cycles. This is because the effect of the prepulse transmitted at the beginning of each segment holds up for four repetition times of four phase encode steps and thus it is applied only at the beginning of each segment.

On the other hand, the 90 degrees excitation RF pulse at the beginning of each cycle corresponds to an MR signal of one phase encode step, respectively. This is because the effect of the 90 degrees excitation RF pulse holds up only for a repetition time of one phase encode step.

In FIG. 4, at the timing immediately after completing the acquisition of the MR signal of one phase encode step, acquisition of the MR signal corresponding to the 90 degrees excitation RF pulse, that has been already transmitted, has been finished whereas acquisition of the MR signals corresponding to the transmitted prepulse has not been completed.

At the timing when the MR signals of the first segment just finishes, the acquisition of the MR signals corresponding to the transmitted prepulse is completed and the acquisition of the MR signals corresponding to the four transmitted 90 degrees excitation RF pulses is also completed.

Thus, as shown in FIG. 5, the candidate calculating unit 66 calculates the timing between the first segment and the second segment as the earliest candidate timing, and calculates the timing between the second segment and the third segment as the next candidate timing. That is, in the case of a pulse sequence of an FFE method, each of the timings between one segment and the next segment is the candidate timing.

Note that, if a CF scan is inserted, an RF pulse as a blank shot may be transmitted immediately after inserting the CF scan. The above RF pulse as a blank shot means, for example, an RF pulse transmitted in order to align longitudinal magnetization between phase encode steps and stabilize state of spin.

In some cases, an RF pulse as a blank shot is transmitted between the respective segments or between the respective repetition times, regardless of whether a CF scan is inserted or not.

When an RF pulse as a blank shot is transmitted between the respective segments, it is assumed that this RF pulse as a blank shot corresponds to the MR signals of one segment subsequently acquired.

In addition, when an RF pulse as a blank shot is transmitted between the respective repetition times, it is assumed that this RF pulse as a blank shot corresponds to the MR signal of one phase encode step subsequently acquired.

Figure 6:
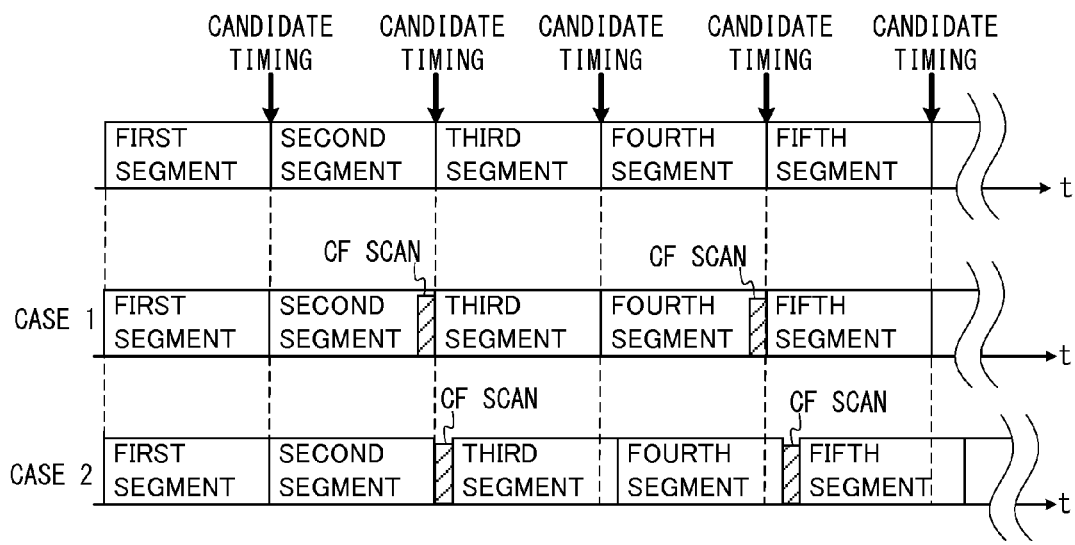
FIG. 6 is an explanatory diagram showing an example of shift of a pulse sequence in a case where CF scans are inserted.

FIG. 6 is an explanatory diagram showing an example of shift of a pulse sequence in a case where CF scans are inserted. In FIG. 6, each horizontal axis indicates elapsed time, the upper part corresponds to the pulse sequence before inserting the CF scans, the middle part indicates the first method of inserting the CF scans in (the middle of) the pulse sequence, and the bottom part indicates the second method of inserting the CF scans in the pulse sequence. As to methods of inserting the CF scans in the pulse sequence, for example, the following two cases are possible.

Firstly, the insertion timing (insert timing) corresponds to a part of an initial vacant period in the pulse sequence and the length of the vacant period is equal to or longer than an implementation term of a CF scan. This corresponds to CASE 1 in FIG. 6.

The above implementation term of a CF scan means, for example, a period until acquisition of MR signals is completed after transmitting RF pulses of a CF scan and the influence on nuclear spin given by the RF pulses of the CF scan completely disappears.

In such a case, the influence of a CF scan on the MR signals acquired for image reconstruction is negligible without delaying the part of the pulse sequence after inserting the CF scan.

In addition, by defining the implementation term of a CF scan as above, the influence of the RF pulses of a CF scan can be avoided, regardless of whether the CF scan is performed on a spatially localized region or the CF scan is performed so as to include the entire imaging region.

Secondly, it is a case where the part of the pulse sequence following the inserted CS scan is delayed by the length of the implementation term of the inserted CF scan after inserting the CF scan. This corresponds to CASE 2 in FIG. 6.

In this case, totally, the pulse sequence is lengthened by the length of "implementation term of one CF scan" times "the number of the inserted CF scans".

It is preferable to apply the CASE 2 if at least one of the following two conditions is not satisfied, i.e. the first condition is that the insertion timing corresponds to a part of an initial vacant period in the pulse sequence, and the second condition is that the length of the vacant period is equal to or longer than an implementation term of one CF scan.

Figure 7:
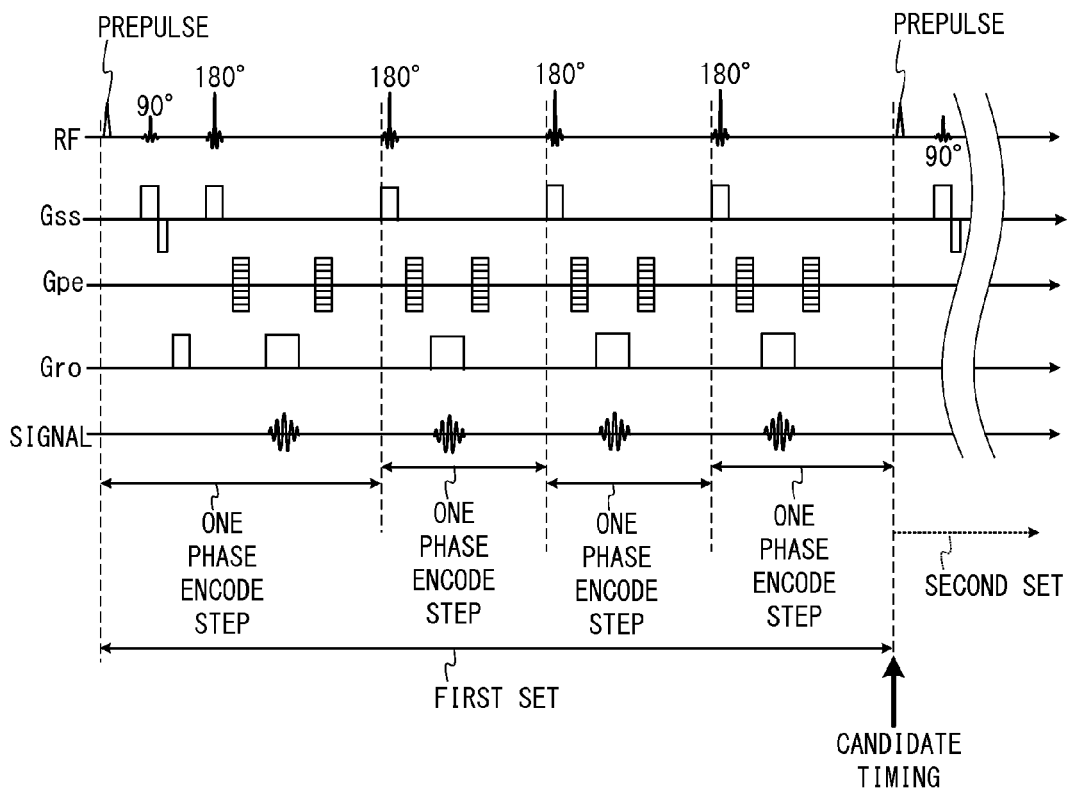
FIG. 7 is a local timing chart showing each candidate timing for inserting a CF scan in an example of a pulse sequence on the basis of an FSE method in the same notation as FIG. 4.

FIG. 7 is a local timing chart showing each candidate timing for inserting a CF scan in an example of a pulse sequence on the basis of an FSE (Fast Spin Echo) method in the same notation as FIG. 4.

As an example here, consider a case where MR signals for an image of one slice are separately acquired in 64 sets of the first set to the sixty-fourth sets and the phase encode step number and the frequency encode step number of the image are both 256.

In this case, for example, a prepulse such as a fat suppression prepulse or the like is transmitted at the beginning of each set. However, he transmission of a prepulse is optional (nonessential).

Next, a gradient magnetic field pulse in the slice selection direction and an excitation RF pulse whose flip angle is 90 degrees are simultaneously applied.

Next, a gradient magnetic field pulse in the readout direction is applied for a half span of the application span of the gradient magnetic field pulse in the readout direction applied at the timing of detecting the MR signal.

Next, a 180 degrees refocusing RF pulse is transmitted at the same time as a gradient magnetic field pulse in the slice selection direction is applied.

Next, the gradient magnetic field pulse in the phase encode direction is applied.

Next, an MR signal is detected under application of the gradient magnetic field in the readout direction.

Then, at the end of one cycle, a compensation gradient magnetic field pulse, whose polarity is inverted from the gradient magnetic field pulse in the phase encode direction applied earlier in the cycle, is applied in the phase encode direction. Thereby, the influence of the gradient magnetic field in the phase encode direction is canceled before the next cycle.

The foregoing is the acquisition of the MR signal of one phase encode step.

After this, the MR signals of three phase encode steps are acquired by repeating the similar operation three times except that neither the prepulse nor the 90 degrees excitation RF pulse is applied.

This concludes the first set, and after the first set, the MR signals of four phase encode steps are acquired as the second set in the way similar to above.

The prepulse and the 90 degrees excitation RF pulse are applied only at the beginning of each set.

In the above pulse sequence of an FSE method, "the timing at which the influence of the RF pulses of a CF scan on the MR signals used for reconstruction of image data is avoided" is each timing between one set and the subsequent set. That is, the candidate calculating unit 66 calculates each timing between one set and the subsequent set as the candidate timings, respectively.

Note that, in the case of a normal spin echo method, i.e. in the case of applying the 90 degrees excitation RF pulse (and the prepulse) each time of detecting an MR signal of one phase encode step, the candidate timing is each timing at which acquisition of one phase encode step completes.

Similarly, in the case of a normal field echo method, the candidate timing is each timing at which acquisition of one phase encode step completes.

Figure 8:
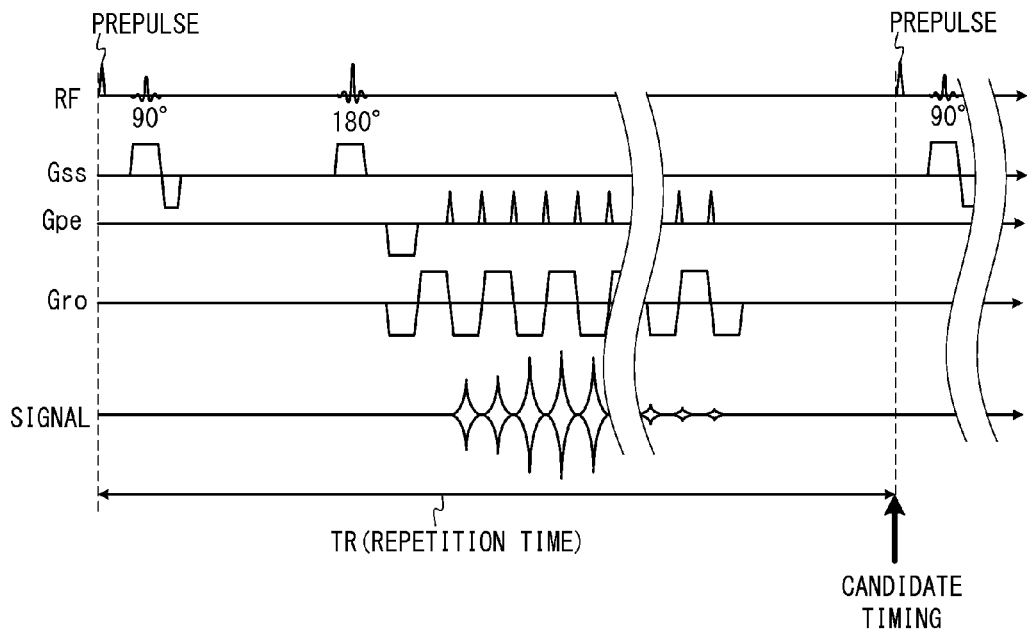
FIG. 8 is a local timing chart showing each candidate timing for inserting a CF scan in an example of a pulse sequence on the basis of a single shot EPI method in the same notation as FIG. 4.

FIG. 8 is a local timing chart showing each candidate timing for inserting a CF scan in an example of a pulse sequence on the basis of a single shot EPI (Echo Planar Imaging) method, in the same notation as FIG. 4.

Because FIG. 8 indicates an EPI of spin echo system, after transmission a prepulse such as the fat suppression prepulse or the like, the 90 degrees excitation RF pulse is transmitted in synchronization with application of the gradient magnetic field pulse in the slice selection direction.

Next, a 180 degrees refocusing RF pulse is transmitted together with application of a gradient magnetic field pulse in the slice selection direction.

Next, a prepulse of a gradient magnetic field in the phase encode direction is applied, and application of the gradient magnetic field in the readout direction is simultaneously started.

After this, each time the polarity of the gradient magnetic field in the readout direction is inversed, a short-span gradient magnetic field pulse in the phase encode direction, whose polarity is opposite to the prepulse of the gradient magnetic field in the phase encode direction, is applied.

In the case of the above single shot EPI method, each candidate timing is the timing immediately after completing acquisition of the MR signals for one image. The candidate timing is the same as above not only in the single EPI of a spin echo system but also in other single shot EPI such as a gradient echo system.

The reason is as follows. In the above timing, acquisition of the respective MR signals corresponding to all the transmitted RF pulses has been completed as to all the RF pulses that have been already transmitted, and the influence of the RF pulses of the CF scan on the MR signals used for reconstruction of image data is avoided.

Note that, in the case of a multi-shot EPI method, each timing immediately after completing acquisition of the MR signals corresponding to one excitation RF pulse is the candidate timing.

In addition, in the case of a fast imaging sequence using SSFP (Steady State Free Precession) such as a TrueFISP (fast imaging with steady precession) method, for example, each timing between each segment and its subsequent segment and the timing immediately after completing acquisition of the MR signals for one image are the candidate timings.

In addition, in the case where a plurality of images are obtained in the same imaging region and these obtained images are averaged to make one average image in order to improve S/N (Signal To Noise) ratio, the acquisition of the MR signals of these plural images is defined as one loop.

When averaging is performed in the above manner, each timing between each loop and the subsequent loop may be defined as the candidate timing as long as it satisfies the condition that the influence of the RF pulses of the CF scan is avoided.

Figure 9:
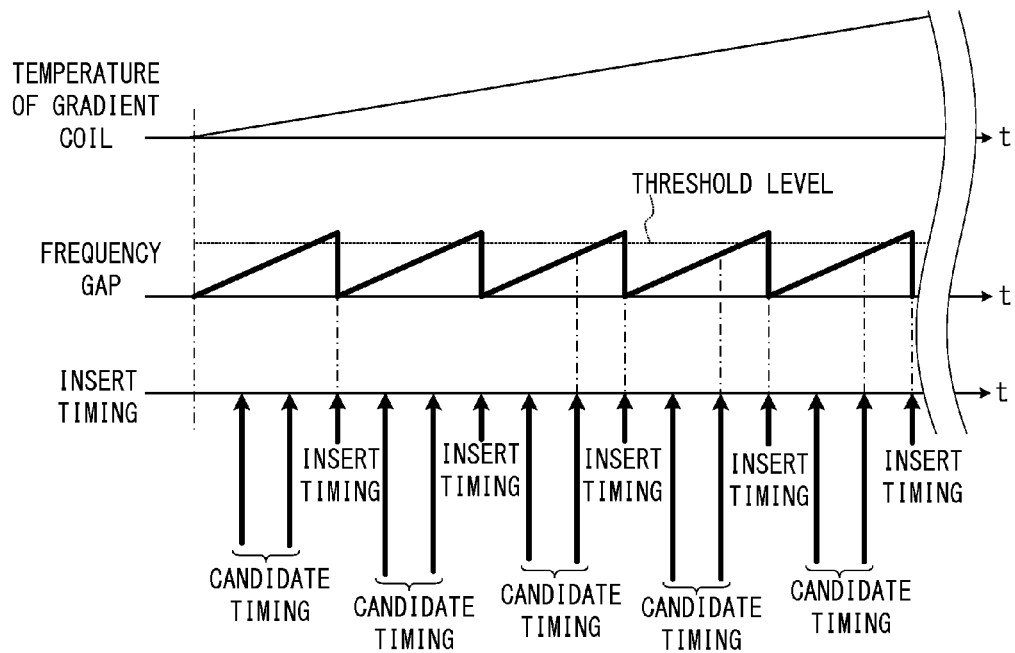
FIG. 9 is a schematic timing chart showing an example of methods of determining insertion timing of the CF scans, on the basis of the gap between the center frequency of the RF pulses and the resonance center frequency calculated from the temperature variation of the gradient magnetic field coil.

FIG. 9 is a schematic timing chart showing an example of methods of determining insertion timing of the CF scans, on the basis of the gap between the center frequency of the RF pulses and the resonance center frequency calculated from the temperature variation of the gradient magnetic field coil.

In FIG. 9, each horizontal axis indicates elapsed time from the start of the pulse sequence, and the upper part indicates the temperature variation of the gradient magnetic field coil unit 33.

The middle part of FIG. 9 indicates time variation of the gap between the center frequency of the RF pulses and the resonance center frequency at that time, and it is calculated from the temperature variation of the gradient magnetic field coil unit 33.

The bottom part of FIG. 9 indicates insertion timings of CF scans selected out of the plurality of candidate timings.

For the sake of simplifying the explanation here, the temperature of the gradient magnetic field coil unit 33 is approximated by the temperature of the iron shims. Thereby, in the example of FIG. 9, as shown in the upper part, the temperature of the gradient magnetic field coil unit 33 and the temperature of the iron shims rises in accordance with a lapse of time from the start of the pulse sequence.

As shown in the middle part of FIG. 9, because the resonance center frequency of the hydrogen atoms inside the object P in the gantry 30 shifts in accordance with the temperature rise of the iron shims, the difference between the center frequency of the RF pulses and the resonance center frequency at that time gradually increases.

Then, as shown in the bottom part of FIG. 9, each time the gap between the center frequency of the RF pulses and the resonance center frequency at that time reaches the threshold value or a predetermined level indicated by a dashed line, the candidate timing subsequent to the time point when the gap reaches the threshold value is selected (determined) as each insertion timing of the CF scan.

Each time the CF scan is executed, the center frequency of the RF pulses is corrected on the basis of the execution result of the CF scan and thereby the difference from the actual resonance center frequency at that time becomes approximately zero.

Operation of the First Embodiment

Figure 10:
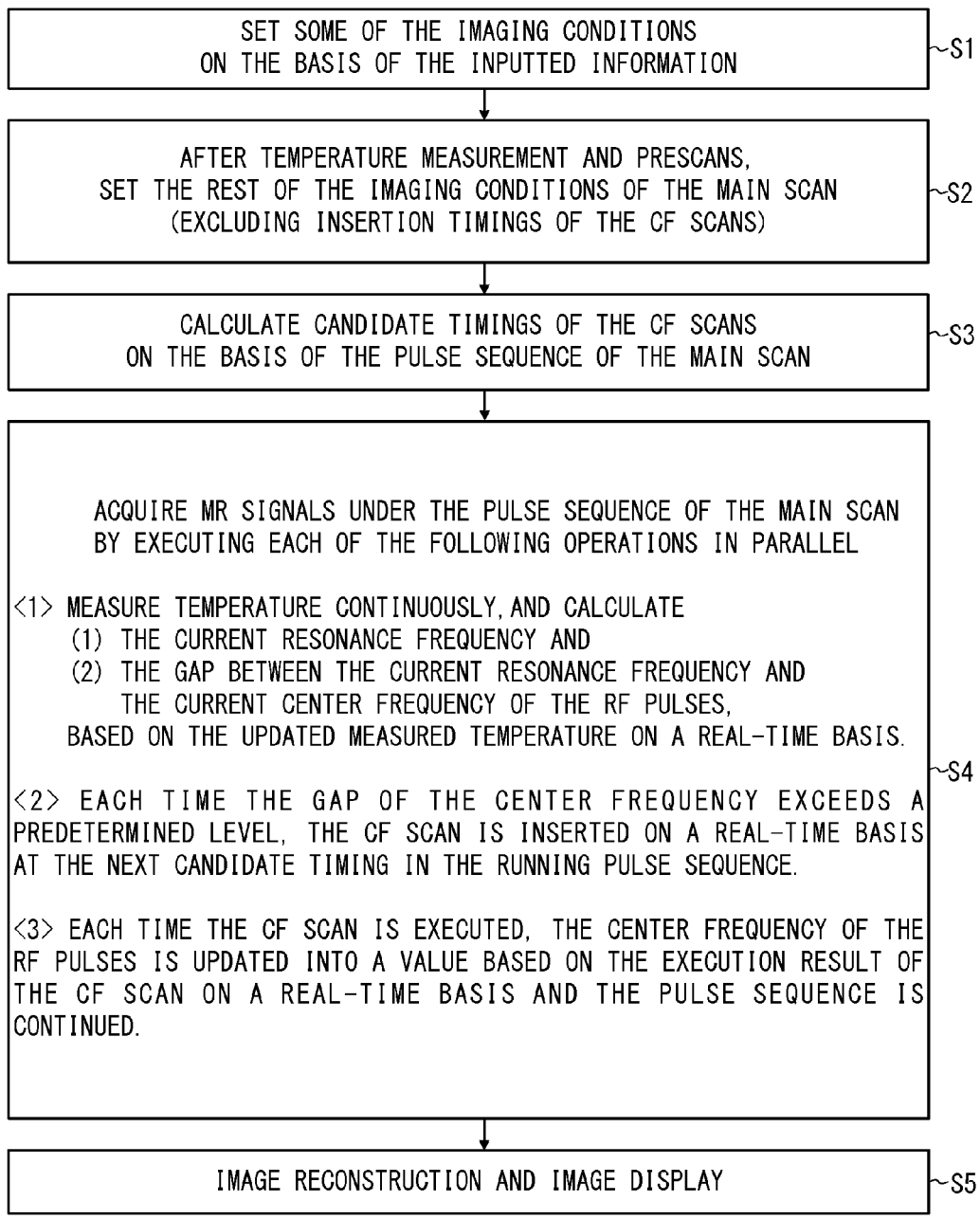
FIG. 10 is a flowchart illustrating an example of a flow of an imaging operation of the MRI apparatus of the first embodiment.

FIG. 10 is a flowchart illustrating a flow of a process performed by the MRI apparatus 10 of the first embodiment. In the following, according to the step numbers in the flowchart shown in FIG. 10, an operation of the MRI apparatus 10 will be described by referring to the aforementioned FIG. 1 to FIG. 9 as required.

[Step S1] The system control unit 61 (see FIG. 1) performs initial setting of the MRI apparatus 10 on the basis of the imaging conditions inputted to the MRI apparatus 10 via the input device 72, and sets some of the imaging conditions such as the type of the pulse sequence.

After this, the process proceeds to Step S2.

[Step S2] By performing prescans, the MRI apparatus 10 calculates under what conditions imaging is performed. For example, conditions such as the power necessary for tilting the longitudinal magnetization component of nuclear spin by 90 degrees (i.e. 90 degrees condition) are calculated.

In addition, a CF scan as a prescan is performed and the center frequency of the RF pulses such as the fat suppression prepulse and the excitation pulse is calculated by the system control unit 61 on the basis of the execution result of the CF scan.

In addition, each of the temperature sensors 36A to 36D (see FIG. 2 and FIG. 3) detects temperature inside the gradient magnetic field coil unit 33 at the execution timing of the CF scan, and inputs the measured values to the gap calculating unit 65 and the system control unit 61 via the sequence controller 58.

The gap calculating unit 65 and the system control unit 61 store the above detected temperature as an initial temperature in combination with the center frequency obtained in this Step S2.

Note that, as to the initial temperature, for example, the average value of the respective temperature values detected by the temperature sensors 36A to 36D can be used.

In this manner, the system control unit 61 sets the rest of the imaging condition of the main scan (excluding the timings of inserting the CF scan).

After this, the process proceeds to Step S3.

[Step S3] The candidate calculating unit 66 calculates the plurality of candidate timings on the basis of the conditions of the pulse sequence of the main scan determined in Step S2 as explained with FIG. 4 to FIG. 8, and inputs the calculation results to the system control unit 61.

[Step S4] The system control unit 61 makes the MRI apparatus 10 perform acquisition of MR signals under the pulse sequence of the main scan, by controlling each component thereof in accordance with the imaging conditions determined in Step S2.

As an example here, the center frequency of the RF pulses used at the start timing of the pulse sequence of the main scan is the value calculated in Step S2.

More specifically, the object P is loaded on the table 22, and a static magnetic field is formed in the imaging space by the static magnetic field magnet 31 excited by the static magnetic field power supply 42. In addition, electric currents are supplied from the shim coil power supply 44 to the shim coil unit 32, and thereby the static magnetic field formed in the imaging space is uniformed.

Then, the MR signals are collected in parallel with execution of the following first to third processes on a real-time basis.

Firstly, each of the temperature sensors 36A to 36D detects the temperature inside the gradient magnetic field coil unit 33 at constant time interval, and respectively inputs the measured temperature value to the gap calculating unit 65 and the system control unit 61 via the sequence controller 58.

The gap calculating unit 65 approximates the temperature of the iron shims by the average value of the temperature values respectively detected by the temperature sensors 36A to 36D, and calculates the actual resonance center frequency on the basis of this average value. Note that, because the cooling water circulates in the actual system (see FIG. 3), the temperature of the gradient magnetic field coil unit 33 is slightly different from the temperature of the iron shims.

As to the calculation method of the resonance center frequency, for example, the method mentioned in Japanese Patent Application Laid-open (KOKAI) Publication No. 2012-30051 can be used. That is, table data of shift amount of the resonance center frequency in accordance with the amount of temperature variation is preliminarily stored in the gap calculating unit 65 from the time of installment and adjustment work, for example.

The gap calculating unit 65 calculates the shift amount of the resonance center frequency, by collating the gap between the initial temperature and the average value of the temperatures detected by the temperature sensors 36A to 36D with the table data.

The gap calculating unit 65 can calculate the actual resonance center frequency at that time, by shifting the resonance center frequency at the initial temperature calculated in the CF scan of Step S2 by the above shift amount.

In addition, the gap calculating unit 65 calculate the gap between the currently selected center frequency of the RF pulses and the actual resonance center frequency calculated in the above manner, and inputs the calculation results to the system control unit 61.

Because the temperature measurement by the temperature sensors 36A to 36D is continued at constant time interval, the calculation of the gap between the currently selected center frequency of the RF pulses and the actual resonance center frequency is performed by the gap calculating unit 65 at constant time interval. That is, the gap between the currently selected center frequency of the RF pulses and the actual resonance center frequency is sequentially inputted to the system control unit 61 on a real-time basis.

Secondly, each time the gap between the currently selected (used) center frequency of the RF pulses and the actual resonance center frequency exceeds the threshold value (or a predetermined value), the system control unit 61 resets (modifies) the pulse sequence in such a manner that the CF scan is inserted at the closest (next) candidate timing in the pulse sequence. As to this method, it has been explained with FIG. 6 and FIG. 8.

As to the above predetermined value for the gap, it is preferable to set it in such a manner that image quality becomes within allowable range in consideration of the following trade-off. That is, the smaller the predetermined value for the gap is, the more times the CF scans are performed so as to improve the image quality while it causes possibility of lengthening imaging time and increasing SAR.

Note that, the above SAR is a specific absorption ratio, and means the energy of the RF pulses absorbed by 1 kg. For the sake of safety, it is prescribed that the SAR value for an arbitrarily set period of 10 seconds and the SAR value for an arbitrarily set period of 6 minutes do not exceed a first upper limit and a second upper limit, respectively. The upper limit of the SAR value varies depending on the region to be imaged, such as the whole body and the head.

As to the insertion method, each CF scan is inserted in (the middle of) the pulse sequence on the basis of CASE 1 or CASE 2 (see FIG. 6), depending on whether the both of the following conditions are satisfied or not: One of the conditions is that the insertion timing corresponds to an initial vacant time in the pulse sequence, and the other is that the length of the vacant time is equal to or longer than the implementation term of the CF scan.

Thirdly, each time a CF scan is performed, the system control unit 61 calculates the resonance center frequency on the basis of the execution results of the CF scan, and updates the center frequency of the RF pulses into the calculated resonance center frequency. That is, the pulse sequence is continued by updating the center frequency of the RF pulses immediately after executing the CF scan.

Note that, hardware operation of the pulse sequence is as follows.

When the system control unit 61 receives a start command of imaging from the input device 72, the system control unit 61 inputs imaging conditions including the pulse sequence into the sequence controller 58. Then, the sequence controller 58 drives the gradient magnetic field power supply 46, the RF transmitter 48 and the RF receiver 50 in accordance with the inputted pulse sequence, thereby gradient magnetic fields are formed in the imaging region including the imaging part of the object P, and RF pulses are generated from the RF coil unit 34.

Thus, MR signals generated by nuclear magnetic resonance inside the object P are detected by the RF coil device 100 and the reception RF coil device 24, and inputted to the RF receiver 50.

The RF receiver 50 performs the aforementioned predetermined signal processing on the detected MR signals so as to generate the raw data of MR signals, and inputs these raw data into the image reconstruction unit 62.

The image reconstruction unit 62 arranges and stores the raw data of MR signals as k-space data.

By executing the above first to third processes in parallel, each time the gap between the center frequency of the RF pulses and the resonance center frequency at that time reaches the threshold value, the CF scan is inserted at the candidate timing subsequent to the time point when the gap reaches the threshold value (see the bottom part of FIG. 9).

Immediately after executing the CF scan, the gap between the center frequency of the RF pulses and the actual resonance center frequency at that time becomes approximately zero.

However, because electric currents are supplied to the gradient magnetic field coil unit 33 in accordance with continuation of the pulse sequence, the heat generation of the gradient magnetic field coil unit 33 continues until the end of the pulse sequence in principle. Therefore, even though the cooling medium is circulated in the cooling pipes 38 by the cooling control device 52, the temperature of the gradient magnetic field coil unit 33 and the temperature of the iron shims increase and the gap (difference) between the center frequency of the RF pulses and the resonance center frequency becomes large again.

When the gap exceeds the threshold value, the CF scan is inserted and thus the gap between the center frequency of the RF pulses and the resonance center frequency at that time becomes approximately zero.

By inserting the CF scan on a real-time basis in the above manner, the pulse sequence is continued to acquire the MR signals while the gap between the center frequency of the RF pulses and the resonance center frequency is controlled so as not to significantly exceed the threshold value.

After completion of the pulse sequence, the process proceeds to Step S5.

[Step S5] The image reconstruction unit 62 reconstructs image data by performing image reconstruction processing including Fourier transformation on the k-space data, and stores the reconstructed image data in the image database 63.

The image processing unit 64 obtains the image data from the image database 63, and generates two-dimensional display image data by performing predetermined image processing on the obtained image data.

The image processing unit 64 stores the display image data in the storage device 76. After this, the system control unit 61 makes the display device 74 display images indicated by the display image data of the scout images.

The foregoing is a description of an operation of the MRI apparatus 10 of the first embodiment.

In the following, the difference between the present embodiment and the conventional technology will be explained.

For example, in the case of dynamic imaging, acquisition of MR signals for a plurality of images is repeated at specified time intervals in one time phase (one loop). Then, though imaging is succeeded by the first time phase (the first loop), the second time phase (the second loop), the third time phase (the third loop) . . . , each loop is the same pulse sequence except that imaging time (at which time point an object is imaged) is the only difference.

In addition, for example, in the case of DWI (Diffusion weighted Imaging), imaging is succeeded by the next loop each time the b-factor changes, and the same operation is repeated in the first loop, the second loop . . . .

In the conventional technology, for example, the center frequency of the RF pulses is corrected on the basis of the measured temperature in the vacant period selected by a user out of the vacant periods between each time phase and the subsequent time phase of dynamic imaging. That is, in the conventional technology, a CF scan is never inserted in the middle of one loop. On the other hand, in the first embodiment, as explained with FIG. 4 and FIG. 7, a CF scan is inserted in the middle of one loop including in the middle of acquisition of the MR signals of one image. This point is the big difference between the present embodiment and the conventional technology.

That is, the update timing of the center frequency of the RF pulses is not limited to a timing between each loop and its subsequent loop, and the center frequency of the RF pulses can be updated by performing a CF scan at each candidate timing in the middle of one loop (including in the middle of acquisition of the MR signals of one image). Thus, according to the first embodiment, the center frequency of the RF pulses can be updated (corrected) at more appropriate timing than the conventional technology.

In the first embodiment, regardless of whether it is in the middle of one loop or not, a CF scan is inserted at the closest (next) candidate timing in the pulse sequence so as to update the center frequency of the RF pulses, each time the gap between the currently used center frequency of the RF pulses and the actual resonance center frequency calculated from the temperature measurement result exceeds the threshold value.

By inserting a CF scan on a real-time basis in the above manner, the pulse sequence is continued while the gap between the center frequency of the RF pulses and the resonance center frequency is controlled so as not to significantly exceed the threshold value.

Thus, firstly, a case where the gap between the center frequency of the RF pulses and the resonance center frequency considerably exceeds the threshold value never occurs.

In addition, secondly, each candidate timing is calculated before the start of the pulse sequence as a timing that is unlikely to cause artifact as mentioned earlier.

By considering the above two points, even if the temperature of the gantry 30 rises by continuing the pulse sequence, the effect of a prepulse such as the fat suppression prepulse or the like is never degraded by the shift of the resonance center frequency. That is, regardless of the shift of the resonance center frequency caused by the heat generation of the gradient magnetic field coil, the center frequency of the RF pulses is always approximately adjusted to the resonance center frequency, and thus satisfactory images are obtained.

The longer the imaging time is like the dynamic imaging, the more the temperature of the gradient magnetic field coil unit 33 increases so as to shift the resonance center frequency. Especially in such a case, the effects of the first embodiment are significantly obtained.

Thus, according to the first embodiment, because the MRI apparatus 10 can follow the change of the resonance center frequency, and thus it can minimize the cooling function for the gradient magnetic field coil unit 33 resulting in reduce in cooling cost. In addition, it can follow the change of the resonance center frequency, the gradient magnetic field coil unit 33 whose thermal conductivity is high (i.e. its thermal capacity is low) can be used.

According to the aforementioned embodiment, regardless of the shift of the resonance center frequency caused by the heat generation of the gradient magnetic field coil, the center frequency of the RF pulses can be adjusted more appropriately than the conventional technology.

The Second Embodiment

In the first embodiment, an example, in which the timings of inserting the CF scans are determined on a real-time basis on the basis of the temperature measurement result, has been explained.

On the other hand, in the second embodiment, an example, in which the temperature measurement for the sake of determining the timings of inserting the CF scans is not performed and the timings of inserting the CF scans are determined on the basis of the imaging conditions before starring the pulse sequence, will be explained.

Note that, in an actual MRI apparatus, its system is designed to stop for the sake of safety when the temperature of the gantry 30 reaches a predetermined temperature such as 90 degrees centigrade as an example, and the temperature measurement and control for achieving this is performed.

Thus, the MRI apparatus in the second embodiment is the same as the MRI apparatus 10 of the first embodiment explained by using FIG. 1 to FIG. 3 in terms of hardware.

Figure 11:
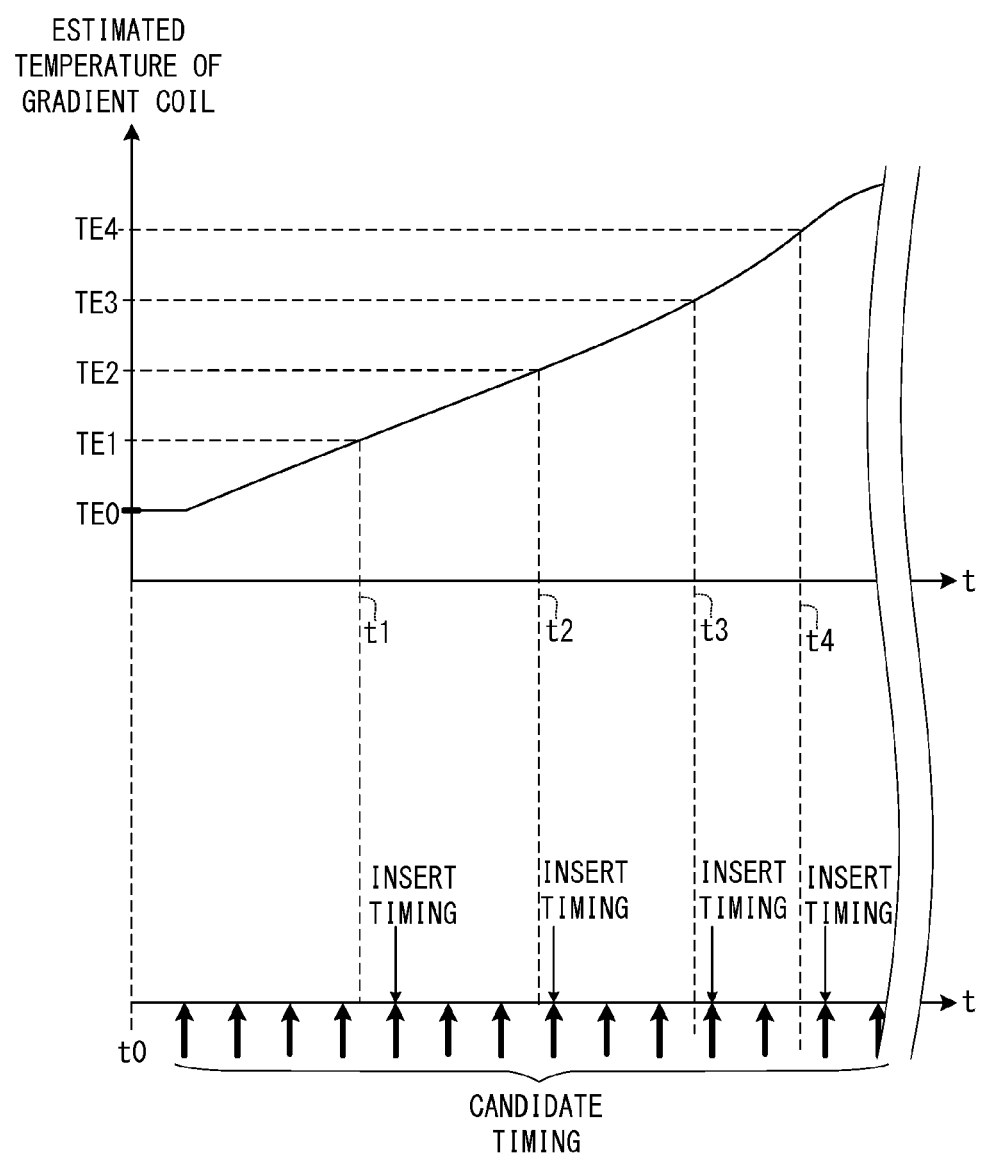
FIG. 11 is a schematic timing chart showing an example of relationship between the estimated temperature variation of the gradient magnetic field coil and each insertion timing of the CF scan.

FIG. 11 is a schematic timing chart showing an example of relationship between estimated temperature variation of the gradient magnetic field coil and insertion timings of the CF scans.

The upper part of FIG. 11 indicates an estimated temperature variation of the gradient magnetic field coil from the start time t0 of the pulse sequence. In the upper part of FIG. 11, the vertical axis indicates the temperature of the gradient magnetic field coil, and the horizontal axis indicates the elapsed time t from the start of the pulse sequence.

In the example of the hardware structure of FIG. 1 to FIG. 3, the aforementioned "gradient magnetic field coil" corresponds to six elements which are the X axis gradient magnetic field coil 33$mx$, the Y axis gradient magnetic field coil 33$my$, the Z axis gradient magnetic field coil 33$mz$, the X axis shield coil 33$sx$, the Y axis shield coil 33$sy$ and the Z axis shield coil 33$sz$. Thus, "the temperature of the gradient magnetic field coil" may be interpreted, for example, the average temperature of these six coils, and hereinafter it is referred to as the temperature of the gradient magnetic field coil unit 33.

The lower part of FIG. 11 indicates the candidate timings of the CF scans and the insertion timings of the CF scans, its horizontal axis indicates the elapsed time t from the start of the pulse sequence just like the upper part.

In the following, an example of calculating the insertion timings of the CF scans will be explained.

Firstly, the candidate calculating unit 66 calculates the candidate timings on the basis of the conditions of the pulse sequence in the same way as the first embodiment (the lower part of FIG. 11).

In addition, the CF scan is executed just before the start of the pulse sequence, and the center frequency of the RF pulses at the start of the pulse sequence is determined so as to reflect the execution result.

Thus, at the start time t0 of the pulse sequence, it is assumed that there is no gap between the resonance center frequency and the center frequency of the RF pulses.

On the other hand, the gap calculating unit 65 calculates (estimates) the time when the gap between the resonance center frequency and the center frequency of the RF pulses caused by the shift of the resonance center frequency exceeds the threshold value (a predetermined level).

The above "the time when the gap exceeds the threshold value" can be converted into the elapsed time from the start of the pulse sequence, by using the start time t0 of the pulse sequence as an criterion, for example.

The above shift of the resonance center frequency arises from the variation of magnetic permeability in accordance with the temperature increase of the iron shims, and the reasons for the temperature increase of the iron shims are as follows.

Firstly, one of the reasons is a factor that conducts the heat generation of the gradient magnetic field coil unit 33 so as to heat up the iron shims.

Secondly, another of the reasons is a factor that causes the heat generation of the iron shims due to eddy current magnetic fields caused by the variation of the gradient magnetic fields.

Here, the magnetic permeability approximately linearly varies with temperature within a normal operating temperature range of the MRI apparatus 10 (from 20 to 90 degrees centigrade, for example). This embodiment takes advantage of this phenomenon.

More specifically, if the magnetic permeability of the iron shims linearly varies as the temperature rises, the magnetic intensity (Tesla) of the magnetic field in the imaging region also linearly varies as the temperature rises, and accordingly, the center frequency of the resonance center frequency in the imaging region also linearly varies as the temperature rises. This is because the Larmor frequency is proportional to the intensity of the applied magnetic field.

Moreover, by approximating the temperature variation of the iron shims by the temperature variation of the gradient magnetic field coil unit 33, the time variation of the shift amount of the resonance center frequency can be approximated by the temperature variation of the gradient magnetic field coil unit 33.

Thus, as an example here, the gap calculating unit 65 calculates the estimated temperature variation of the gradient magnetic field coil unit 33, and treats this temperature variation as the time variation of the shift amount of the resonance center frequency.

The heat generation of the gradient magnetic field coil unit 33 is caused by the electric current supply to the gradient magnetic field coil. Note that, because the thermal energy given to the gradient magnetic field coil is proportional to the product of the square of the electric current and an ohmic value, voltage is not considered here.

Thus, the estimated temperature variation of the gradient magnetic field coil unit 33 can be calculated from the thermal energy given to the gradient magnetic field coil unit 33, on the basis of the time variation of the electric currents supplied to the gradient magnetic field coil (including duty ratio) in the imaging conditions.

More specifically, for example, the gap calculating unit 65 calculates each time integration value of an absolute value of the electric current supplied to the gradient magnetic field coil from the start time t0 to the ending time of the pulse sequence at a fixed time interval, respectively.

The gap calculating unit 65 approximates the estimated temperature variation of the gradient magnetic field coil unit 33 by the time variation of the time integration value, then approximates the estimated temperature variation of the iron shims by this (approximated) estimated temperature variation of the gradient magnetic field coil unit 33, and further approximates the estimated time variation of shift amount of the resonance center frequency by this estimated temperature variation of the gradient magnetic field coil unit 33.

In this case, the system control unit 61 inserts the CF scan at each timing immediately after the estimated temperature of the gradient magnetic field coil unit 33 increases by a predetermined temperature increment TP (i.e. each time the resonance center frequency shifts by a constant value).

Note that, it is preferable to set the predetermined temperature increment TP in such a manner that image quality is accommodated within an allowable range in consideration of the trade-off mentioned in the first embodiment in accordance with the gap between the center frequency of the RF pulses and the resonance center frequency.

In the upper part of FIG. 11, the temperature TE0 is an estimated temperature of the gradient magnetic field coil unit 33 at the start time t0 of the pulse sequence, for example, it can be treated as the criterion temperature of the gantry 30 before start of imaging controlled by the cooling control device 52.

Note that, calculation of a concrete value of the temperature TE0 is optional (non-essential) when the gradient magnetic field coil unit 33 is in the state of generating heat by a previously executed pulse sequence. Because the CF scan is performed before the start of the pulse sequence so as to make the gap between the center frequency of the RF pulses and the resonance center frequency become approximately zero temporarily, it is sufficient to simply recognize how much the temperature is raised.

In the upper part of FIG. 11, each of the temperatures TE1, TE2, TE3, TE4 is a temperature raised by the predetermined temperature increment TP from the previous temperature starting from the temperature TE0.

The time point when the estimated temperature of the gradient magnetic field coil unit 33 becomes TE1 is defined as t1. Similarly, the time points when the estimated temperature of the gradient magnetic field coil unit 33 respectively become TE2, TE3 and TE4 are respectively defined as t2, t3 and t4. In this case, as shown in the bottom part of FIG. 11, the system control unit 61 selects the respective candidate timings, which are immediately after the time points t1, t2, t3 and t4, as the insertion timings of the CF scans, out of the plurality of candidate timings.

Each time the CF scan is executed in (the middle of) the pulse sequence, the center frequency of the RF pulses is updated so as to temporarily return the gap between the center frequency of the RF pulses and the resonance center frequency to approximately zero.

Therefore, to perform the CF scan immediately after each timing when the estimated temperature of the gradient magnetic field coil unit 33 increases by the predetermined temperature TP is equivalent to performing the CF scan each time when the gap between the center frequency of the RF pulses and the resonance center frequency exceeds the predetermined level.

Thus, in the pulse sequence causing a great amount of the heat generation of the gradient magnetic field coil such as EPI, the temperature increase of the gradient magnetic field coil unit 33 is rapid and accordingly the insertion frequency of CF scans per unit time increases.

Note that, though the calculation method of the estimated temperature variation of the gradient magnetic field coil unit 33 may be simplified as mentioned above, other methods may be alternatively used.

For example, by executing pulse sequences while measuring the temperature variation of the gradient magnetic field coil unit 33 with the use of the temperature sensors 36A to 36D at the time of the install adjustment of the MRI apparatus 10, patterns of temperature variations of many types of pulse sequences can be converted into data as experimental values. Then, at the time of the install adjustment, temperature variation data per pulse sequence may be stored in the gap calculating unit 65.

In this case, the gap calculating unit 65 can calculate the estimated temperature variation of the gradient magnetic field coil unit 33 by selecting the pulse sequence data closest to the pulse sequence to be executed, out of the stored temperature variation data.

More specifically, the selected temperature variation data of the pulse sequence may be modified on the basis of the time variation of the time integration value of the gap in the electric current supplied to the gradient magnetic field coil between the selected pulse sequence and the pulse sequence to be executed.

Figure 12:
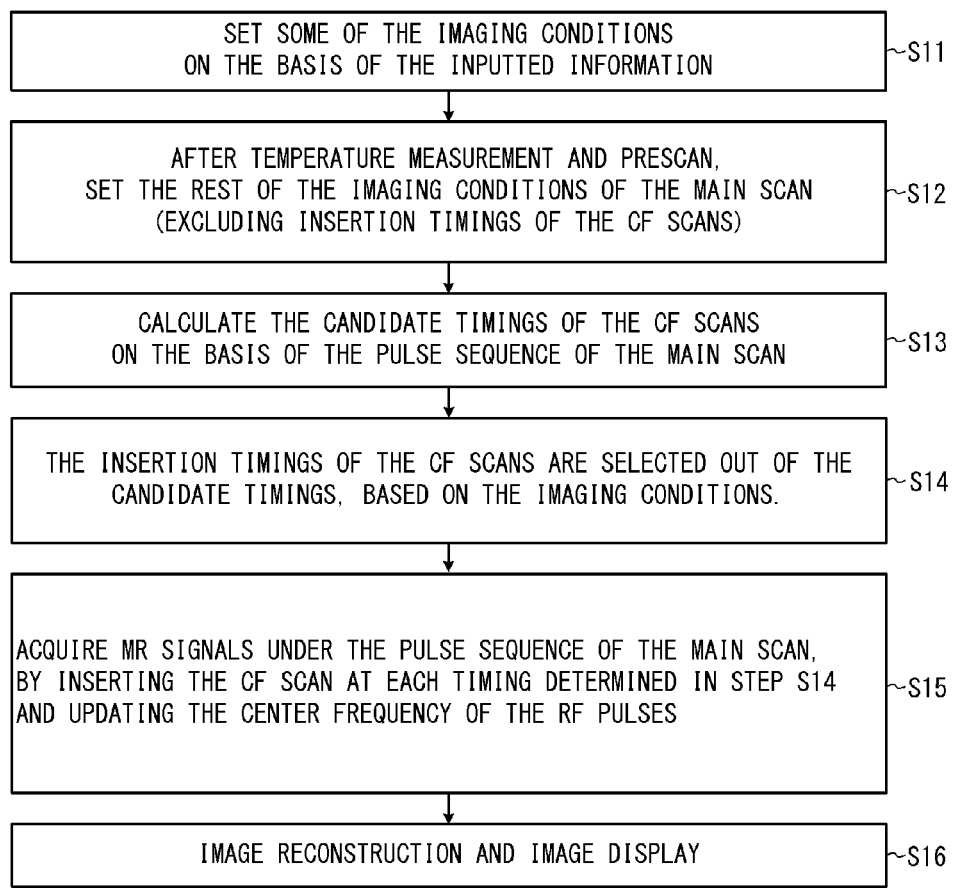
FIG. 12 is a flowchart illustrating an example of a flow of an imaging operation of the MRI apparatus of the second embodiment.

FIG. 12 is a flowchart illustrating a flow of a process performed by the MRI apparatus 10 of the second embodiment. In the following, according to the step numbers in the flowchart shown in FIG. 12, an operation of the MRI apparatus 10 will be described.

[Step S11 to Step S13] The contents of Step S11 to Step S13 are respectively the same as Step S1 to Step S3 in the first embodiment, and overlapping explanation is abbreviated.

After this, the process proceeds to Step S14.

[Step S14] The gap calculating unit 65 calculates the estimated temperature variation of the gradient magnetic field coil unit 33 on the basis of the time variation of the electric current supplied to the gradient magnetic field coil under the imaging conditions, approximates the estimated temperature variation of the iron shims by this calculated result, and further approximates the estimated time variation of the shift amount of the resonance center frequency by this. As to this calculation method, it is explained earlier.

The system control unit 61 sets the pulse sequence by selecting the timings of inserting the CF scan out of the plurality of candidate timings, in such a manner that the CF scan is inserted at the closest (next) candidate timing in the pulse sequence each time the estimated temperature of the gradient magnetic field coil unit 33 increases by the predetermined temperature TP. This is equivalent to executing the CF scan each time the gap between the center frequency of the RF pulses and the resonance center frequency reaches a predetermined level.

After this, the process proceeds to Step S15.

[Step S15] The system control unit 61 controls each component of the MRI apparatus 10 so as to make the MRI apparatus 10 perform the pulse sequence of the main scan whose conditions are determined in Step S14.

That is, the CF scans are executed at each timing selected in Step S14. Then, each time CF scan is executed, the center frequency of the RF pulses is updated into a value reflecting the execution result of the CF scan and the pulse sequence is continued.

In this manner, the pulse sequence is executed and the MR signals are acquired from the imaging region.

After this, the process proceeds to Step S16.

[Step S16] The content of Step S16 is the same as Step S5 in the first embodiment, and overlapping explanation is abbreviated.

The foregoing is a description of the operation of the MRI apparatus 10 according to the second embodiment.

As just described, in the second embodiment, at which timings and how frequently the CF scans are inserted is adjusted before the start of the pulse sequence on the basis of the estimated temperature variation of the gradient magnetic field coil unit 33. Thus, the same effects as the first embodiment are obtained in the second embodiment, too.

Moreover, in the second embodiment, there is a merit that the temperature measurement during the pulse sequence for determining the insertions timings of the CF scans can be omitted.

Supplementary Notes of the Embodiments

[1] In the first embodiment and the second embodiment, the calculation of the resonance center frequency, the candidate timing or the like and the computing of setting the pulse sequence again so as to insert the CF scans are automatically executed by the corresponding components in the operation device 60.

However, as to the insertion timings of the CF scans, each of the above embodiments is not limited to the aspect of being completely automatically executed by the operation device 60.

For example, as to the threshold value for the gap between the center frequency of the RF pulses and the resonance center frequency in the first embodiment, it may inputted via the input device 72 by a user.

Alternatively, the MRI apparatus 10 may be configured in such a manner that the display device 74 displays the candidate timings automatically calculated in Step S3 and some of the timings of inserting the CF scan are selected by an operator via the input device 72.

For example, each component such as the input device 72 may be configured to enable an operator to select a pattern in which the CF scan is inserted at each timing when acquisition of MR signals for at least a predetermined number of images completes, as long as the timing corresponds to one of the candidate timings.

[2] In the first embodiment, an example in which a CF scan is inserted at the closest (next) candidate timing each time the gap between the currently used center frequency of the RF pulses and the actual resonance center frequency calculated from the temperature measurement result exceeds the threshold value has been explained.

However, embodiments of the present invention are not limited to such an aspect.

For example, the system control of the MRI apparatus 10 may be performed so as to update the center frequency of the RF pulses by inserting the CF scan at the next candidate timing, each time the temperature of the gradient magnetic field coil unit 33 based on the temperature measurement increases by the predetermined temperature increment.

[3] Considering the size of the gradient magnetic field coil unit 33, temperature does not become uniform inside the gradient magnetic field coil unit 33 if heat generation occurs due to execution of the main scan. For example, consider a case where many number of temperature sensors are arranged separately in the X axis direction, the Y axis direction and the Z axis direction inside the gradient magnetic field coil unit 33.

In this case, in the first embodiment, the temperature difference detected by each temperature sensor is multiplied by a weight coefficient in such a manner that the closer to the imaging cross-section one temperature sensor is, the higher the weight coefficient for this temperature sensor is, for example.

Then, each temperature difference multiplied by each weight coefficient is totalized for the number of the temperature sensors. The weighted average temperature difference is calculated by dividing the totalized temperature difference by the number of the temperature sensors. The shift amount of the center frequency may be calculated on the basis of the weighted average temperature difference as mentioned above.

[4] Correspondences between terms used in the claims and terms used in the embodiment described above will be described. Note that the correspondences described below are just some of possible interpretations for reference and should not be construed as limiting the present invention.

The functions of the entire structure including each component in the gantry 30 and the static magnetic field power supply 42, the shim coil power supply 44, the gradient magnetic field power supply 46, the RF transmitter 48 and the RF receiver 50, and the sequence controller 58 (see FIG. 1) that receive MR signals from the object P under a pulse sequence with application of gradient magnetic fields and RF pulses are an example of the signal acquisition unit described in the claims.

The system control unit 61 that sets the pulse sequence so as to insert CF scans at the timings in accordance with the plurality of candidate timings and the gap calculated by the gap calculating unit 65 is an example of the sequence setting unit described in the claims.

The temperature sensors 36A to 36D are examples of the temperature measuring unit described in the claims.

[5] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus that acquires nuclear magnetic resonance signals from an imaging region by executing a pulse sequence with application of a gradient magnetic field and RF pulses and reconstructs image data based on the nuclear magnetic resonance signals, the magnetic resonance imaging apparatus comprising:
    a gap calculating unit configured to calculate a gap between a center frequency of an RF pulse and a center frequency of magnetic resonance of hydrogen atoms in the imaging region, after start of the pulse sequence;
    a candidate calculating unit configured to calculate a plurality of candidate timings for inserting a center frequency scan based on imaging conditions so as to avoid influence of the center frequency scan on the nuclear magnetic resonance signals used for reconstructing the image data, when the center frequency scan is inserted in the pulse sequence, the center frequency scan being a scan in which the center frequency of magnetic resonance of hydrogen atoms is measured with application of an RF pulse;
    a sequence setting unit configured to set the pulse sequence in such a manner that the center frequency scan is inserted in the pulse sequence at a timing according to the plurality of candidate timings and the gap;
    a signal acquisition unit configured to acquire the nuclear magnetic resonance signals from the imaging region by executing the pulse sequence, in such a manner that the center frequency of an RF pulse is set again to a value reflecting an execution result of the center frequency scan and then the pulse sequence is continued each time of executing the center frequency scan; and
    an image reconstruction unit configured to reconstruct the image data based on the nuclear magnetic resonance signals acquired by the signal acquisition unit.

2. The magnetic resonance imaging apparatus according to claim 1,
    wherein the candidate calculating unit is configured to calculate an earliest candidate timing so as to become a timing which is after completion of acquiring the nuclear magnetic resonance signals corresponding to all of RF pulses transmitted after the start of the pulse sequence, and to calculate rest of the candidate timings so as to become timings which are respectively after completion of acquiring the nuclear magnetic resonance signals corresponding to all of RF pulses transmitted after an immediately preceding candidate timing.

3. The magnetic resonance imaging apparatus according to claim 2, further comprising:
    a gradient magnetic field coil unit configured to apply a gradient magnetic field in accordance with supplied electric current; and
    a temperature measuring unit configured to measure temperature of the gradient magnetic field coil unit during implementation term of the pulse sequence,
    wherein the gap calculating unit is configured to calculate time variation of the gap between the center frequency of an RF pulse and the center frequency of magnetic resonance of hydrogen atoms in the imaging region based on measuring result of the temperature measuring unit during implementation term of the pulse sequence,
    the sequence setting unit is configured to calculate an insertion timing of a next center frequency scan, base on the time variation of the gap and the plurality of candidate timings, and
    the signal acquisition unit is configured to continue the pulse sequence by inserting the center frequency scan at the insertion timing in the pulse sequence.

4. The magnetic resonance imaging apparatus according to claim 3,
    wherein the sequence setting unit is configured to calculate the insertion timing, in such a manner that the center frequency scan is inserted each time the gap exceeds a predetermined level.

5. The magnetic resonance imaging apparatus according to claim 4,
    wherein the candidate calculating unit is configured to calculate a timing between one set and next one set as each of the plurality of candidate timings, when the pulse sequence is a Fast Spin Echo method in which all of phase encode steps of the nuclear magnetic resonance signals for one image are acquired by repeating an operation of one set, the operation of one set being an operation of executing transmission of a refocusing RF pulse and acquisition of a nuclear magnetic resonance signal of one phase encode step plural times sequentially after transmitting an excitation RF pulse.

6. The magnetic resonance imaging apparatus according to claim 4,
    wherein the candidate calculating unit is configured to calculate a timing between one segment and next one segment as each of the plurality of candidate timings, when the pulse sequence is a Fast Field Echo method in which all of phase encode steps of the nuclear magnetic resonance signals for one image are acquired by repeating an operation of one segment, the operation of one segment being an operation of executing transmission of an excitation RF pulse and acquisition of a nuclear magnetic resonance signal of one phase encode step plural times sequentially after transmitting a pre-pulse.

7. The magnetic resonance imaging apparatus according to claim 4,
    wherein the candidate calculating unit is configured to calculate each of the plurality of candidate timings so as to become a timing which is after acquisition of the nuclear magnetic resonance signals for one image and before transmission of an RF pulse corresponding to the nuclear magnetic resonance signals for next one image, when the pulse sequence is a single shot echo planar imaging.

8. The magnetic resonance imaging apparatus according to claim 4,
wherein the sequence setting unit is configured to set the pulse sequence so as to include a fat suppression prepulse for suppressing a nuclear magnetic resonance signal from fat tissue in RF pulses.

9. The magnetic resonance imaging apparatus according to claim 2,
wherein the gap calculating unit is configured to calculate a time when the gap exceeds a predetermined level, based on the imaging conditions; and
the sequence setting unit is configured to set the pulse sequence by selecting at least one of the plurality of candidate timings for an insertion timing of the center frequency scan based on the time when the gap exceeds the predetermined level.

10. The magnetic resonance imaging apparatus according to claim 9, further comprising a gradient magnetic field coil unit configured to apply the gradient magnetic field based on supplied electric current to the imaging region,
wherein the gap calculating unit is configured to calculate the time when the gap exceeds the predetermined level, by calculating time variation of shift of the center frequency of magnetic resonance of hydrogen atoms based on (A) a time integration value of the supplied electric current or (B) time variation of electric current supplied to the gradient magnetic field coil unit according to the imaging condition.

11. The magnetic resonance imaging apparatus according to claim 10,
wherein the candidate calculating unit is configured to calculate a timing between one set and next one set as each of the plurality of candidate timings, when the pulse sequence is a Fast Spin Echo method in which all of phase encode steps of the nuclear magnetic resonance signals for one image are acquired by repeating an operation of one set, the operation of one set being an operation of executing transmission of a refocusing RF pulse and acquisition of a nuclear magnetic resonance signal of one phase encode step plural times sequentially after transmitting an excitation RF pulse.

12. The magnetic resonance imaging apparatus according to claim 10,
wherein the candidate calculating unit is configured to calculate a timing between one segment and next one segment as each of the plurality of candidate timings, when the pulse sequence is a Fast Field Echo method in which all of phase encode steps of the nuclear magnetic resonance signals for one image are acquired by repeating an operation of one segment, the operation of one segment being an operation of executing transmission of an excitation RF pulse and acquisition of a nuclear magnetic resonance signal of one phase encode step plural times sequentially after transmitting a prepulse.

13. The magnetic resonance imaging apparatus according to claim 10,
wherein the candidate calculating unit is configured to calculate each of the plurality of candidate timings so as to become a timing which is after acquisition of the nuclear magnetic resonance signals for one image and before transmission of an RF pulse corresponding to the nuclear magnetic resonance signals for next one image, when the pulse sequence is a single shot echo planar imaging.

14. The magnetic resonance imaging apparatus according to claim 10,
wherein the sequence setting unit is configured to set the pulse sequence so as to include a fat suppression prepulse for suppressing a nuclear magnetic resonance signal from fat tissue in RF pulses.

15. The magnetic resonance imaging apparatus according to claim 1,
wherein the candidate calculating unit is configured to calculate a timing between one set and next one set as each of the plurality of candidate timings, when the pulse sequence is a Fast Spin Echo method in which all of phase encode steps of the nuclear magnetic resonance signals for one image are acquired by repeating an operation of one set, the operation of one set being an operation of executing transmission of a refocusing RF pulse and acquisition of a nuclear magnetic resonance signal of one phase encode step plural times sequentially after transmitting an excitation RF pulse.

16. The magnetic resonance imaging apparatus according to claim 1,
wherein the candidate calculating unit is configured to calculate a timing between one segment and next one segment as each of the plurality of candidate timings, when the pulse sequence is a Fast Field Echo method in which all of phase encode steps of the nuclear magnetic resonance signals for one image are acquired by repeating an operation of one segment, the operation of one segment being an operation of executing transmission of an excitation RF pulse and acquisition of a nuclear magnetic resonance signal of one phase encode step plural times sequentially after transmitting a prepulse.

17. The magnetic resonance imaging apparatus according to claim 1,
wherein the candidate calculating unit is configured to calculate each of the plurality of candidate timings so as to become a timing which is after acquisition of the nuclear magnetic resonance signals for one image and before transmission of an RF pulse corresponding to the nuclear magnetic resonance signals for next one image, when the pulse sequence is a single shot echo planar imaging.

18. The magnetic resonance imaging apparatus according to claim 1,
wherein the sequence setting unit is configured to set the pulse sequence so as to include a fat suppression prepulse for suppressing a nuclear magnetic resonance signal from fat tissue in RF pulses.

19. A magnetic resonance imaging method that acquires nuclear magnetic resonance signals from an imaging region by executing a pulse sequence with application of a gradient magnetic field and RF pulses and reconstructs image data based on the nuclear magnetic resonance signals, the magnetic resonance imaging method comprising steps of:
calculating a gap between a center frequency of an RF pulse and a center frequency of magnetic resonance of hydrogen atoms in the imaging region, after start of the pulse sequence;
calculating a plurality of candidate timings for inserting a center frequency scan based on imaging conditions so as to avoid influence of the center frequency scan on the nuclear magnetic resonance signals used for reconstructing the image data, when the center frequency scan is inserted in the pulse sequence, the center frequency scan being a scan in which the center frequency of magnetic resonance of hydrogen atoms is measured with application of an RF pulse;

setting the pulse sequence, in such a manner that the center frequency scan is inserted in the pulse sequence at a timing according to the plurality of candidate timings and the gap;

acquiring the nuclear magnetic resonance signals from the imaging region by executing the pulse sequence, in such a manner that the center frequency of an RF pulse is set again to a value reflecting an execution result of the center frequency scan and then the pulse sequence is continued each time of executing the center frequency scan; and reconstructing the image data based on the nuclear magnetic resonance signals acquired by the pulse sequence.

\* \* \* \* \*